(12) United States Patent
Pan et al.

(10) Patent No.: US 12,532,588 B2
(45) Date of Patent: Jan. 20, 2026

(54) BRACKET AND LED DEVICE

(71) Applicant: FOSHAN NATIONSTAR OPTOELECTRONICS CO., LTD., Foshan (CN)

(72) Inventors: Libing Pan, Foshan (CN); Zhiguo Xie, Foshan (CN); Man Zhao, Foshan (CN); Jiapeng Zhang, Foshan (CN); Danwei Li, Foshan (CN); Pingxia Liang, Foshan (CN); Fuhai Li, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 538 days.

(21) Appl. No.: 18/090,665

(22) Filed: Dec. 29, 2022

(65) Prior Publication Data
US 2023/0216011 A1 Jul. 6, 2023

(30) Foreign Application Priority Data

Dec. 31, 2021 (CN) ........................ 202111677014.3
Dec. 31, 2021 (CN) ........................ 202111680067.0

(51) Int. Cl.
*H10H 20/857* (2025.01)
*H10H 20/85* (2025.01)
(Continued)

(52) U.S. Cl.
CPC ......... *H10H 20/857* (2025.01); *H10H 20/856* (2025.01)

(58) Field of Classification Search
CPC ............ H10H 20/857; H10H 20/8506; H10H 20/852; H10H 20/856; H10H 20/851; H01L 23/495
See application file for complete search history.

(56) References Cited

FOREIGN PATENT DOCUMENTS

| CN | 204167312 U | 2/2015 |
| CN | 105977246 A | 9/2016 |

(Continued)

OTHER PUBLICATIONS

Translation of CN prior application search report, App. No. 2021116770143, dated Dec. 31, 2021, pp. 1-6.
(Continued)

*Primary Examiner* — Antonio B Crite
(74) *Attorney, Agent, or Firm* — CM Law; Stephen J. Weed

(57) ABSTRACT

Provided are a bracket and a LED device. The bracket includes a lead frame and a molded structure connected to the lead frame. The lead frame includes a first lead portion, a second lead portion, and a barrier structure. The first lead portion includes a first base. The second lead portion includes a second base spaced from the first base. A gap between the first base and the second base forms a channel. The barrier structure is disposed on a side of at least one of the first base or the second base facing the channel. The barrier structure is disposed between two opposite ends of the first base and/or the second base and protrudes from the first base and/or the second base, and a length between two opposite ends of the channel is greater than a length of a middle part so that a "wide-narrow-wide" pattern is formed.

20 Claims, 15 Drawing Sheets

(51) Int. Cl.
*H10H 20/858* (2025.01)
*H10H 20/856* (2025.01)

(56) References Cited

FOREIGN PATENT DOCUMENTS

| CN | 107210352 A | | 9/2017 |
|----|-------------|---|--------|
| CN | 207489809 U | | 6/2018 |
| CN | 108511580 A | | 9/2018 |
| CN | 102299240 A | | 11/2018 |
| CN | 108807638 A | | 11/2018 |
| CN | 213692038 U | | 7/2021 |
| JP | 2013058739 A | * | 3/2013 |
| KR | 0170111176 A | | 10/2017 |

OTHER PUBLICATIONS

Translation of OA1 of CN prior application, App. No. 202111677014.3, dated Sep. 8, 2023, pp. 1-8.
Translation of CN prior application search report, App. No. 2021116800670 dated Dec. 31, 2021, pp. 1-4.
Translation of OA1 of CN prior application, App. No. 202111680067.0 dated Aug. 4, 2023, pp. 1-10.

* cited by examiner

BRACKET AND LED DEVICE

CROSS-REFERENCE TO RELATED APPLICATIONS

This application claims priority to Chinese Patent Application No. 202111677014.3 filed with the China National Intellectual Property Administration (CNIPA) on Dec. 31, 2021 and titled "Bracket and LED device" and Chinese Patent Application No. 202111680067.0 filed with the CNIPA on Dec. 31, 2021 and titled "Frame and light-emitting device", the disclosure of each of which is incorporated herein by reference in its entirety.

TECHNICAL FIELD

Embodiments of the present disclosure relate to lighting technologies and, in particular, to a bracket and a light-emitting diode (LED) device.

BACKGROUND

A light-emitting diode (LED) has advantages of long life, low power consumption, fast response speed and environmental friendliness. In addition to a wide application in the traditional lighting field, the LED also has more and more applications in emerging fields such as smart light poles, plant lighting, and visible light communication.

With the continuous expansion of the application of LED products, the market has higher and higher requirements for the reliable performance of the LED products. In the related art, differences in physical properties exist between a metal frame made of metal and a molded structure made of plastic material. Therefore, the stress is generated at a junction of the metal frame and the molded structure, resulting in an unstable bond between the metal frame and the molded structure. As a result, when a chip is welded to a lead frame, flux intrudes into a chip placement region, reducing the reliability of a LED device.

SUMMARY

A main object of the present disclosure is to provide a bracket and a LED device, where the bracket can improve the reliability of the LED device.

To achieve the preceding object, the present disclosure provides a bracket. The bracket includes a lead frame and a molded structure connected to the lead frame. The lead frame includes a first lead portion, a second lead portion, and a barrier structure. The first lead portion includes a first base. The second lead portion includes a second base spaced from the first base. A gap between the first base and the second base forms a channel. The first lead portion and the second lead portion are insulated from each other. Part of the molded structure is filled in the channel. One barrier structure is disposed on a side of the first base facing the channel and between two opposite ends of the first base in an extension direction of the channel and protrudes from the first base; one barrier structure is disposed on a side of the second base facing the channel and between two opposite ends of the second base in an extension direction of the channel and protrudes from the second base; or one barrier structure is disposed on a side of the first base facing the channel and between two opposite ends of the first base in an extension direction of the channel and protrudes from the first base, and one barrier structure is disposed on a side of the second base facing the channel and between two opposite ends of the second base in the extension direction of the channel and protrudes from the second base. A length between two opposite ends of the channel is greater than a length of a middle part of the channel so that a "wide-narrow-wide" pattern is formed.

In an embodiment, the lead frame includes two barrier structures, where the two barrier structures are respectively disposed on the first base and the second base, the two barrier structures are disposed in a misaligned manner in the extension direction of the channel, and lengths of the two barrier structures are equal in a first direction perpendicular to the extension direction of the channel.

In an embodiment, the lead frame includes two barrier structures, where the two barrier structures are respectively disposed on the first base and the second base, and the two barrier structures are symmetrically arranged about the channel.

In an embodiment, a width of the barrier structure is greater than or equal to 0.25 times a width of the first base or a width of the second base and less than or equal to 0.5 times the width of the first base or the width of the second base; or the length between the two opposite ends of the channel is greater than or equal to 0.1 times a sum of a length of the first base, a length of the channel and a length of the second base and less than or equal to 0.3 times the sum of the length of the first base, the length of the channel and the length of the second base.

In an embodiment, the lead frame further includes a first arc structure disposed on the side of the first base facing the channel, at least one side of the one barrier structure on the first base in the extension direction of the channel is provided with the first art structure, and the one barrier structure on the first base and the first lead portion are connected in a smooth transition through the first arc structure; or the lead frame further includes a first arc structure disposed on the side of the second base facing the channel, at least one side of the one barrier structure on the second base in the extension direction of the channel is provided with the first art structure, and the barrier structure on the second base and the second lead portion are connected in a smooth transition through the first arc structure.

In an embodiment, at least one of the first base or the second base is provided with a through hole. The through hole is an elongated hole, and an included angle exists between a length direction of the through hole and the extension direction of the channel; or the through hole is a circular through hole. The lead frame further includes a first projection connected to an inner wall surface of the through hole, where the first projection extends towards an inner side of the through hole.

In an embodiment, the lead frame further includes a second projection disposed along an outer periphery of at least one of the first base or the second base; and/or the lead frame further includes a third projection disposed on a side of the lead frame facing the channel.

In an embodiment, the first lead portion further includes a plurality of first pins protruding from the first base; and the second lead portion further includes a plurality of second pins protruding from the second base, an extension direction of each of the plurality of first pins is arranged at an angle with or parallel to the extension direction of the channel, an extension direction of each of the plurality of second pins is arranged at an angle with or parallel to the extension direction of the channel, the plurality of first pins are disposed on a side of the first base facing away from the channel, and the plurality of second pins are disposed on a side of the second base facing away from the channel.

In an embodiment, the molded structure includes second arc structures connected to the plurality of first pins of the lead frame, where at least one side of each of the plurality of first pins is provided with a respective one of the second arc structures; and/or the molded structure includes third arc structures connected to the plurality of second pins of the lead frame, where at least one side of each of the plurality of second pins is provided with a respective one of the third arc structures.

In an embodiment, an included angle A exists between an extension direction of one of the plurality of first pins and the extension direction of the channel and satisfies that $A=90°\pm10°$; or an included angle B exists between an extension direction of one of the plurality of second pins and the extension direction of the channel and satisfies that $B=90°\pm10°$.

In an embodiment, the lead frame further includes a first recessed groove, wherein at least one side of the first base is provided with one first recessed groove in the extension direction of the channel, and/or at least one side of the second base is provided with one first recessed groove in the extension direction of the channel.

In an embodiment, the lead frame further includes a plurality of indentations arranged at intervals on a surface of the first base facing the molded structure and/or a surface of the second base facing the molded structure.

In an embodiment, the plurality of indentations extend in the extension direction of the channel and are disposed at an end of the first base away from the channel and/or an end of the second base away from the channel in the first direction perpendicular to the extension direction of the channel.

In an embodiment, the lead frame further includes a second recessed groove, where the side of the first base facing away from the channel is provided with one second recessed groove, and/or the side of the second base facing away from the channel is provided with one second recessed groove.

In an embodiment, the second recessed groove includes at least two groove segments that communicate with each other, where in the first direction, widths of the at least two groove segments decrease sequentially in a direction towards the channel.

In an embodiment, a ratio of widths of two adjacent ones of the at least two groove segments is between 1 and 2.

In an embodiment, the at least two groove segments include a first groove segment, a second groove segment and a third groove segment that communicate sequentially, where in the direction towards the channel, a width of the first groove segment, a width of the second groove segment and a width of the third groove segment decrease sequentially.

In an embodiment, the lead frame includes two first pins spaced apart in the extension direction of the channel; or the lead frame includes two second pins spaced apart in the extension direction of the channel.

Another object of the present disclosure is to provide an LED device including the preceding bracket.

BRIEF DESCRIPTION OF DRAWINGS

Drawings constituting part of the present application are intended to provide a further understanding of the present disclosure, and illustrative embodiment one of the present disclosure and the description thereof are intended to explain the present disclosure and do not constitute an improper limitation of the present disclosure.

Figure 1:
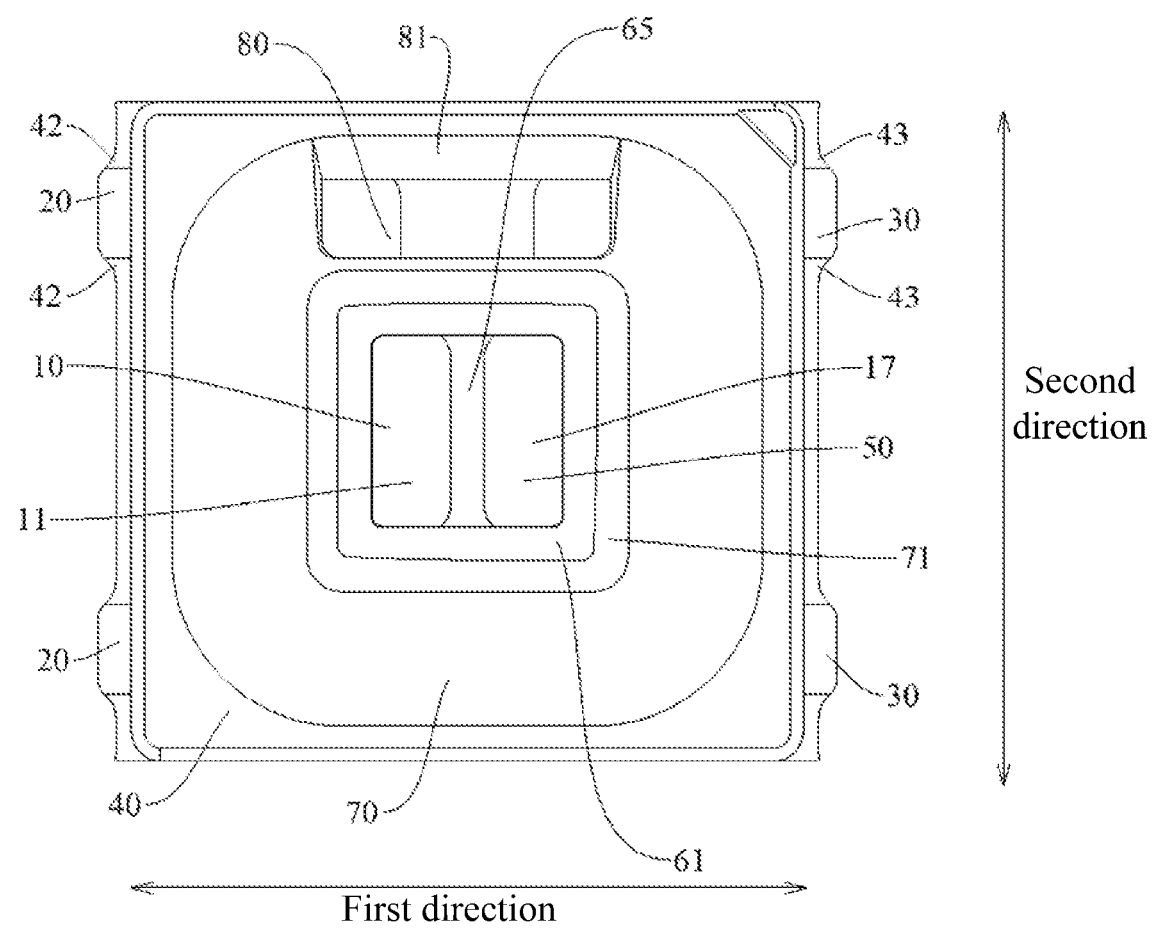
FIG. 1 is a structural diagram of a bracket according to embodiment one of the present disclosure.

REFERENCE List 1 chip
10 lead frame
11 first base
12 channel
13 first recessed groove
14 indentation
15 second recessed groove
151 first groove segment
152 second grove segment
153 third groove segment
16 through hole
17 second base
20 first pin
30 second pin
40 molded structure
42 second arc structure
43 third arc structure
50 barrier structure
51 first arc structure
52 first projection
53 second projection
54 third projection
61 chip placement body
62 escape groove
64 first protrusion
65 barrier
66 second protrusion
70 tubular structure
71 first arc surface
72 second arc surface
73 third arc surface
74 internal through hole
80 accommodation groove 81 inclined surface

DETAILED DESCRIPTION

It is to be noted that if not in collision, the examples and features therein in the present application can be combined with each other. The present disclosure is described below in detail with reference to drawings and in conjunction with embodiments.

It is to be noted that, in embodiments of the present disclosure, a LED device includes a lead frame 10, a molded structure 40, and a chip 1. The molded structure 40 covers a side of the lead frame 10 to form a reflective structure. The reflective structure defines an escape groove 62 for exposing part of the lead frame. The chip 1 is placed at a bottom of the reflective structure and electrically connected to the exposed part of the lead frame 10.

Figure 2:
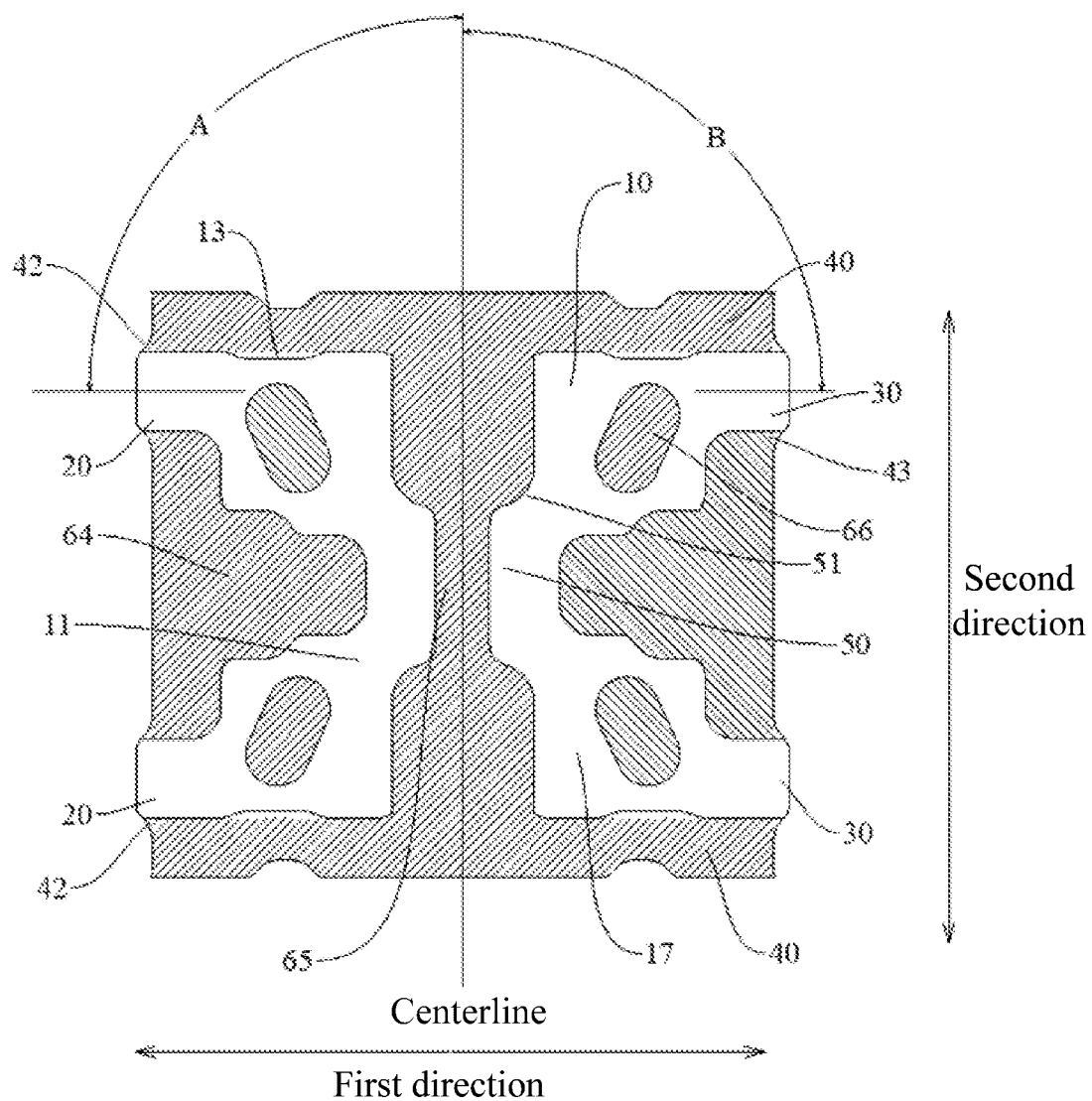
FIG. 2 is a rear view of the bracket in FIG. 1.

It is to be noted that, in the embodiments of the present disclosure, a first direction in FIG. 2 is perpendicular to an extension direction of a channel 12, and a second direction refers to a direction parallel to the extension direction of the channel 12.

It is to be noted that, in the embodiments of the present disclosure, the lead frame 10 is made of metal material.

It is to be noted that, in the embodiments of the present disclosure, the molded structure 40 is made of a mold compound.

Embodiment One

Figure 5:
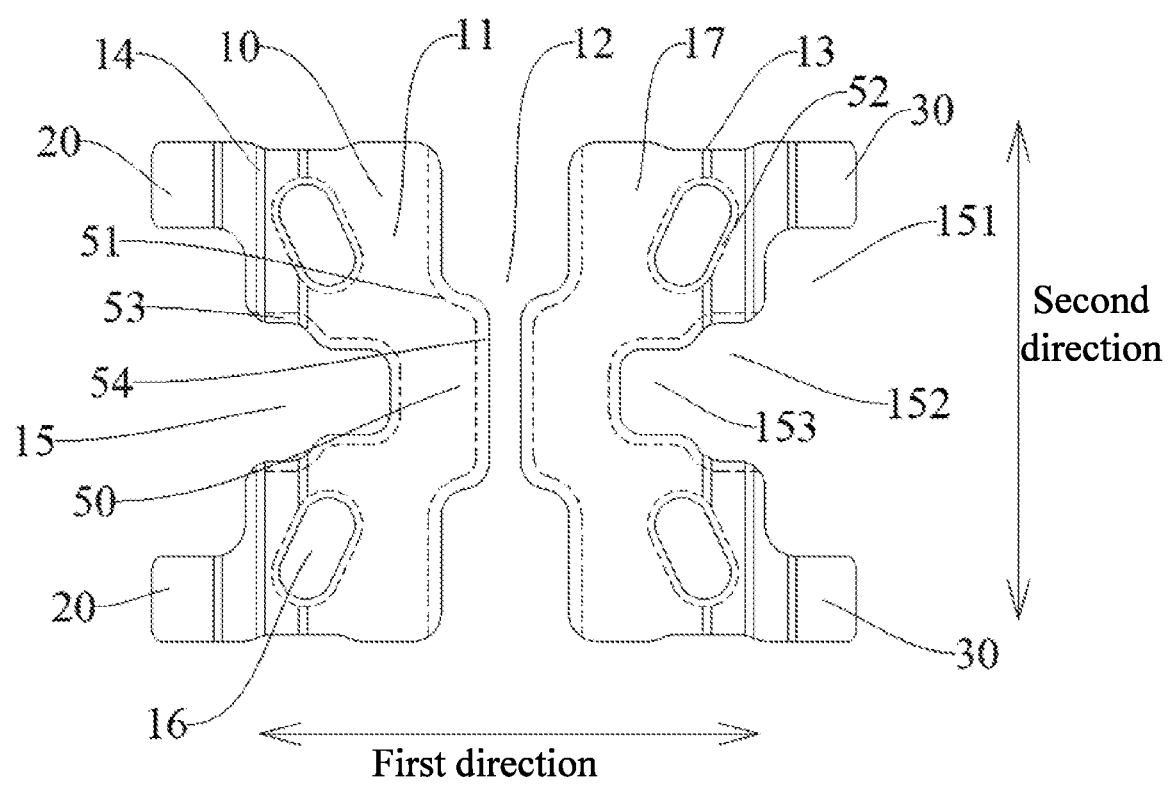
FIG. 5 is a structural diagram of a lead frame of the bracket in FIG. 1.

As shown in FIGS. 1, 2 and 5, embodiment one of the present disclosure provides a bracket. The bracket includes a lead frame 10 and a molded structure 40 connected to the lead frame 10, where the lead frame 10 includes a first lead portion and a second lead portion. The first lead portion includes a first base 11. The second lead portion includes a second base 17 spaced from the first base 11. A gap between the first base 11 and the second base 17 forms a channel 12. The first lead portion and the second lead portion are insulated from each other. Part of the molded structure 40 is filled in the channel 12. A barrier structure 50 is disposed on a side of at least one of the first base 11 or the second base 17 facing the channel 12. In an extension direction of the channel 12, the barrier structure 50 is disposed between two opposite ends of the first base 11 and/or two opposite ends of the second base 17 and protrudes from the first base 11 and/or the second base 17. A length between two opposite ends of the channel 12 is greater than a length of a middle part so that a "wide-narrow-wide" pattern is formed.

In the preceding technical scheme, the barrier structure 50 is provided so that the channel 12 is formed into the "wide-narrow-wide" pattern. In this manner, sufficient welding area can be provided for the welding between the lead frame 10 and the chip 1, and the possibility that flux intrudes into a chip placement region can be reduced. Therefore, the problem of the reduced air tightness caused by the thermal deformation of the lead frame 10 during welding can be avoided, thereby improving the reliability of the LED device.

In the present disclosure and the embodiments of the present disclosure, the preceding bracket may be a bracket for the LED device.

It is to be noted that, in embodiment one of the present disclosure, the channel 12 includes only three groove segments that communicate sequentially in the second direction, the length between the two opposite ends refers to a maximum length of groove segments at two ends among the three groove segments in the first direction, and the length of the middle part refers to a length of a groove segment in the middle among the three groove segments in the first direction. In this manner, a length of a middle of the channel 12 is relatively small and lengths at two ends of the channel 12 are relatively large, that is, the "wide-narrow-wide" pattern in FIG. 2 is formed.

In an implementation, the barrier structure 50 is provided on a side of each of the two lead portions facing the channel 12, so as to form an "I-shaped" channel 12.

In an implementation, the barrier structure 50 may be a rib protruding from the lead portion.

It is to be noted that, in embodiment one of the present disclosure, the case where the barrier structure 50 is disposed on a side of at least one of the first base 11 or the second base 17 facing the channel 12 means that the barrier structure 50 is disposed on the first base 11, or the barrier structure 50 is disposed on the second base 17, or the barrier structure 50 is disposed on each of the first base 11 and the second base 17.

As shown in FIGS. 1, 2 and 5, in embodiment one of the present disclosure, the lead frame 10 includes two barrier structures 50, where the two barrier structures 50 are respectively disposed on the first base 11 and the second base 17, the two barrier structures 50 are disposed in a misaligned manner in the extension direction of the channel 12, and lengths of the two barrier structures 50 are equal in the first direction perpendicular to the extension direction of the channel 12.

In the preceding technical scheme, one barrier structure 50 is disposed on each of the first base 11 and the second base 17. Compared with the case where only one barrier structure 50 is provided, the preceding technical scheme can increase a connection area between the lead frame 10 and the molded structure 40 as much as possible so that the lead frame 10 and the molded structure 40 can be stably bonded, thereby improving the reliability of the LED device.

It is to be noted that, in embodiment one of the present disclosure, the misaligned arrangement of the two barrier structures 50 means that in the extension direction of the channel, at least one end of the barrier structure 50 on the first base 11 protrudes relative to the barrier structure 50 on the second base 17, that is, in the extension direction of the channel, an end of the barrier structure 50 on the first base 11 may protrude relative to an end of the barrier structure 50 on the second base 17, and the other end of the barrier structure 50 on the second base 17 may protrude relative to the other end of the barrier structure 50 on the first base 11; or both two opposite ends of the barrier structure 50 on the first base 11 protrude relative to the barrier structure 50 on the second base 17.

As shown in FIGS. 1, 2 and 5, in embodiment one of the present disclosure, the lead frame 10 includes two barrier structures 50, where the two barrier structures 50 are respectively disposed on the first base 11 and the second base 17, and the two barrier structures 50 are symmetrically arranged about the channel 12.

Since two electrodes of the chip 1 are symmetrically arranged, the preceding arrangement enables the two barrier structures 50 to be better welded to the two electrodes of the chip 1, and the preceding arrangement is simple in structure and easy to machine.

As shown in FIGS. 1, 2 and 5, in embodiment one of the present disclosure, a width of the barrier structure 50 is greater than or equal to 0.25 times a width of the first base 11 or a width of the second base 17 and less than or equal to 0.5 times the width of the first base 11 or the width of the second base 17.

In the preceding technical scheme, the width of the barrier structure 50 is greater than or equal to 0.25 times the width of the first base 11 or the width of the second base 17, so as to ensure a sufficient welding area between the chip 1 and the lead frame 10; and the width of the barrier structure 50 is less than or equal to 0.5 times the width of the first base 11 or the width of the second base 17, so as to avoid a width of the channel 12 (a length of the channel 12 in its extension direction) from decreasing and avoid a short circuit between the first lead portion and the second lead portion during welding.

In an implementation, the width of the barrier structure 50 is equal to 0.3 times the width of the first base 11 or the width of the second base 17.

It is to be noted that, in embodiment one of the present disclosure, the width of the barrier structure 50 refers to a length of the barrier structure 50 in the extension direction of the channel 12.

As shown in FIGS. 1, 2 and 5, in embodiment one of the present disclosure, the length between the two opposite ends of the channel 12 is greater than or equal to 0.1 times a sum of a maximum length of the first base 11, a maximum length of the channel 12 and a maximum length of the second base 17 and less than or equal to 0.3 times the sum of the maximum length of the first base 11, the maximum length of the channel 12 and the maximum length of the second base 17.

In the preceding technical scheme, the length between the two opposite ends of the channel 12 is greater than or equal to 0.1 times the sum of the maximum length of the first base 11, the maximum length of the channel 12 and the maximum length of the second base 17, so as to avoid a short circuit between the first lead portion and the second lead portion during welding; and the length between the two opposite ends of the channel 12 is less than or equal to 0.3 times the sum of the maximum length of the first base 11, the maximum length of the channel 12 and the maximum length of the second base 17, so as to ensure a sufficient contact area and a sufficient bonding force between the lead frame 10 and the molded structure 40, thereby improving the air tightness of the LED device, avoiding deformation of the barrier structure 50, and improving the heat dissipation effect.

In an implementation, the length between the two opposite ends of the channel 12 is equal to 0.15 times the sum of the maximum length of the first base 11, the maximum length of the channel 12 and the maximum length of the second base 17.

As shown in FIGS. 1, 2 and 5, in embodiment one of the present disclosure, part of the molded structure 40 is disposed on a side of the lead frame 10, and an escape groove 62 corresponding to the barrier structure 50 is disposed on the molded structure 40 so that the barrier structure 50 is exposed from the escape groove 62.

Through the preceding arrangement, the escape groove 62 may expose the barrier structure 50, thereby facilitating the welding of the chip 1 and the barrier structure 50 and improving the stability of the connection between the chip 1 and the lead frame.

As shown in FIGS. 2 and 5, in embodiment one of the present disclosure, the lead frame further includes a first arc structure 51 on the side of the first base 11 facing the channel 12, the first arc structure 51 is disposed on at least one side of the barrier structure 50 in the extension direction of the channel 12, and the barrier structure 50 and the lead portion are connected in a smooth transition through the first arc structure 51. The lead frame 10 further includes a first arc structure 51 on the side of the second base 17 facing the channel 12, the first art structure 51 is disposed on at least one side of the barrier structure 50 on the second base 17 in the extension direction of the channel 12, and the barrier structure 50 and the second lead portion are connected in a smooth transition through the first arc structure 51.

Through the preceding arrangement, the concentrated stress at a position where the barrier structure 50 and the lead portion are connected can be reduced, thereby improving the strength of the lead frame 10. Further, the preceding structure is simple and easy to machine.

Further, the first arc structure 51 is provided so that the bonding force between the lead frame 10 and the molded structure 40 can be increased and the connection between the lead frame 10 and the molded structure 40 can be more stable.

In an implementation, the first arc structure 51 is provided so as to achieve a smooth connection between the first arc structure 51 and the lead portion. In an implementation, the first arc structure 51 is an arc-shaped chamfer, which is convenient to machine.

In an implementation, the first arc structure 51 is disposed on each of two opposite sides of the barrier structure 50 so that the two opposite ends of the barrier structure 50 can be smoothly connected to the lead portion.

Of course, in an alternative embodiment not shown in the drawings, the first arc structure 51 may be provided on only one side of the barrier structure 50.

As shown in FIGS. 2 and 5, in embodiment one of the present disclosure, a through hole 16 is provided on the first base 11 and/or the second base 17, a second protrusion 66 is disposed on a side of the molded structure 40, and the second protrusion 66 mates with the through hole 16 in shape and size.

Through the preceding arrangement, an inner wall of the through hole 16 may be bonded to an outer wall of the second protrusion 66 so as to improve the bonding force between the lead frame 10 and the molded structure 40.

In an implementation, the through hole 16 is provided on each of the first base 11 and the second base 17, and second protrusions 66 are correspondingly arranged with the through holes 16 so that the bonding force between the lead frame 10 and the molded structure 40 is greater.

Of course, in an alternative embodiment not shown in the drawings, the through hole 16 may be provided on only one of the first base 11 or the second base 17.

As shown in FIGS. 2 and 5, in embodiment one of the present disclosure, the through hole 16 is an elongated hole, and an included angle exists between a length direction of the through hole 16 and the extension direction of the channel 12.

In the preceding technical scheme, the elongated hole is provided so as to reduce a copper layer area of the lead frame 10, thereby reducing the expansion of the heated lead frame during welding and increasing the air tightness of the bracket.

Further, the included angle exists between the length direction of the through hole 16 and the extension direction of the channel 12, thereby increasing a bonding force between the through hole 16 and the molded structure 40 in the first direction and a bonding force between the through hole 16 and the molded structure 40 in the second direction.

In an implementation, as shown in FIG. 2, in embodiment one of the present disclosure, the included angle exists between the length direction of the elongated hole and the extension direction of the channel 12, and a distance between an upper end of the elongated hole and a centerline of the channel 12 is greater than a distance between a lower end of the elongated hole and the centerline of the channel 12.

Of course, in an alternative embodiment not shown in the drawings, the through hole 16 may also be an oval through hole.

As shown in FIGS. 2 and 5, in embodiment one of the present disclosure, multiple through holes 16 are provided and arranged at intervals in the extension direction of the channel 12.

In the preceding technical scheme, the number of the through holes 16 is increased, thereby increasing the connection area between the lead frame 10 and the molded structure 40 and increasing the bonding force between the lead frame 10 and the molded structure 40.

In an implementation, as shown in FIGS. 2 and 5, in embodiment one of the present disclosure, two through holes 16 are provided in the extension direction of the channel 12. Of course, in an alternative embodiment not shown in the drawings, the number of the through holes 16 may be three or four or the like.

As shown in FIG. 5, in embodiment one of the present disclosure, the lead frame 10 further includes a first projection 52 connected to an inner wall surface of the through hole 16, where the first projection 52 extends towards an inner side of the through hole 16, so as to increase a bonding area between the lead frame 10 and the molded structure 40.

In the preceding technical scheme, the first projection 52 is provided on the inner wall surface of the through hole 16. In this manner, a step surface may be formed between the inner wall surface of the through hole 16 and the first projection 52, so as to increase a contact area between the through hole 16 and the molded structure 40 and increase the connection area between the lead frame 10 and the molded structure 40, thereby effectively improving the connection stability between the lead frame 10 and the molded structure 40.

In an implementation, the first projection 52 includes an annular rib. In this manner, the first projection is relatively simple in structure, which is convenient to machine.

Of course, in an alternative embodiment, the first projection 52 may further include multiple rib segments arranged at intervals along a circumferential sidewall of the through hole.

As shown in FIG. 5, in embodiment one of the present disclosure, the bracket further includes a second projection 53 disposed along an outer periphery of at least one of the first base 11 or the second base 17.

In the preceding technical scheme, the second projection 53 is disposed along an outer periphery of the first base 11 and/or an outer periphery of the second base 17, so as to increase a contact area between the lead frame 10 and the molded structure 40. Similarly, the preceding second projection 53 can achieve the same effect as the first projection 52, which is not repeated here.

In an implementation, the second projection 53 includes an elongated rib, which is convenient to machine.

Of course, in an alternative embodiment, the second projection 53 may further include multiple rib segments arranged at intervals along outer peripheries of the first base 11 and the second base 17.

Figure 3:
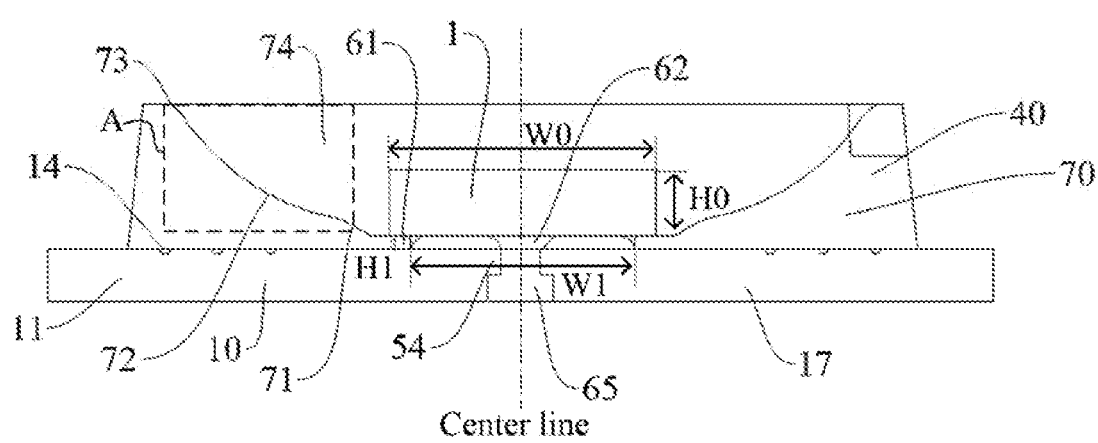
FIG. 3 is a structural diagram of a LED device according to embodiment one of the present disclosure.

As shown in FIGS. 1, 3 and 5, the bracket further includes a third projection 54 disposed on a side of the lead frame 10 facing the channel 12.

In the preceding technical scheme, the third projection 54 is provided on the side of the lead frame 10 facing the channel 12 so that a step surface may be formed between the side of the lead frame 10 facing the channel 12 and the third projection 54. In this manner, the contact area between the lead frame 10 and the molded structure 40 can be increased, thereby effectively improving the connection stability between the lead frame 10 and the molded structure 40. Further, the third projection 54 can increase the air tightness between the lead frame 10 and the molded structure 40.

In an implementation, as shown in FIG. 1, in embodiment one of the present disclosure, the third projection 54 includes an elongated rib, which is convenient to machine.

Of course, in an alternative embodiment, the third projection 54 may further include multiple rib segments arranged at intervals along an edge of the lead frame 10.

As shown in FIGS. 1, 2 and 5, in embodiment one of the present disclosure, the first lead portion further includes multiple first pins 20 protruding from the first base 11, and the second lead portion further includes multiple second pins 30 protruding from the second base 17. Each of an extension direction of the first pin 20 and an extension direction of the second pin 30 is arranged at an angle with or parallel to the extension direction of the channel 12, the multiple first pins 20 are disposed on a side of the first base 11 facing away from the channel 12, and the multiple second pins 30 are disposed on a side of the second base 17 facing away from the channel 12.

In the preceding technical scheme, the multiple first pins 20 are disposed on the side of the first base 11 facing away from the channel 12, the multiple second pins 30 are disposed on the side of the second base 17 facing away from the channel 12, and each of the extension direction of the first pin 20 and the extension direction of the second pin 30 is arranged at an angle with the extension direction of the channel 12. In this manner, the multiple first pins 20 can be disposed on the same side of the first base 11, the multiple second pins 30 can be disposed on the same side of the second base 17, and the multiple first pins 20 and the multiple second pins 30 can be disposed on different sides of the lead frame 10, that is, the pins with the same electrical polarity may be disposed on the same side of the lead frame 10, thereby facilitating a subsequent test performed by a technician on the light-emitting device.

Further, the pins with the same electrical polarity are disposed on the same side of the lead frame 10 and the pins with different electrical polarities are disposed on different sides of the lead frame 10, which is convenient for the technician to distinguish between positive and negative electrodes, thereby facilitating subsequent welding and reworking performed by the technician on the LED device.

Further, the preceding arrangement can reduce an area of side electrodes, reduce the tin climbing onto the copper layer, and avoid the flux from intruding into the inside of the bracket at high temperature.

Specifically, as shown in FIGS. 2 and 5, in embodiment one of the present disclosure, bottom surfaces of the first pins 20 and a bottom surface of the first base 11 are coplanar; and bottom surfaces of the second pins 30 and a bottom surface of the second base 17 are coplanar, thereby facilitating the installation of the LED device.

Specifically, in embodiment one of the present disclosure, the multiple first pins 20 and the multiple second pins 30 are symmetrically arranged about the channel, thereby facilitating a subsequent detection.

Specifically, in embodiment one of the present disclosure, the first lead portion includes two first pins 20 symmetrically arranged, and the second lead portion includes two second pins 30 symmetrically arranged. Compared with a single center electrode (traditional electrode), such arrangement can reduce an offset during welding.

As shown in FIGS. 2 and 5, in embodiment one of the present disclosure, an included angle A exists between the extension direction of the first pin 20 and the extension direction of the channel 12 and satisfies that A=90°±10°; or an included angle B exists between the extension direction of the second pin 30 and the extension direction of the channel 12 and satisfies that B=90°±10°.

Through the preceding arrangement, the first pins 20 may extend in a direction facing away from the channel 12, the second pins 30 may extend in the direction facing away from the channel 12, the multiple first pins 20 may extend in the same direction, and the multiple second pins 30 may extend in the same direction, thereby facilitating the subsequent test performed by the technician on the LED device.

Of course, in an alternative embodiment not shown, the included angle A between the extension direction of the first pin 20 and the extension direction (that is, the second direction) of the channel 12 may be 45°, 60°, 70° or the like; and the included angle B between the extension direction of the second pin 30 and the extension direction (that is, the second direction) of the channel 12 may be 45°, 60°, 70° or the like. The first pins 20 only need to extend in a direction facing away from the second pins 30, and the second pins 30 only need to extend in a direction facing away from the first pins 20.

As shown in FIGS. 2 and 5, in embodiment one of the present disclosure, the lead frame 10 further includes a first recessed groove 13 disposed on at least one side of the first base 11 and/or at least one side of the second base 17 in the extension direction (that is, the second direction) of the channel 12.

In the preceding technical scheme, the first recessed groove 13 is disposed on at least one side of the first base 11 and/or at least one side of the second base 17, so as to increase a length of the edge of the lead frame 10 and effectively increase the connection area between the lead frame and the molded structure 40, thereby making the connection between the lead frame 10 and the molded structure 40 more stable and improving the stability of the LED device.

Further, the first recessed groove 13 is provided, so as to reduce the thermal deformation of the bulk copper layer during welding, that is, reduce the thermal deformation of the first base and/or the second base.

In an implementation, in the extension direction (that is, the second direction) of the channel 12, two opposite sides of the first base 11 and two opposite sides of the second base 17 are provided with first recessed grooves 13. Compared with the case where only one first recessed groove 13 is provided, the preceding arrangement can make the bonding area between the lead frame 10 and the molded structure 40 larger, thereby making the LED device stable.

It is to be noted that, in embodiment one of the present disclosure, the case where in the extension direction of the channel 12, the first recessed groove 13 is disposed on at least one side of the first base 11 and/or at least one side of the second base 17 means that in FIG. 2, in the extension direction of the channel 12, the first recessed groove 13 is disposed on an upper side and/or a lower side of the first base 11 and/or an upper side and/or a lower side of the second base 17, that is, the first recessed groove 13 may be disposed on at least one side of one of the first base 11 or the second base 17, or the first recessed groove 13 may be disposed on at least one side of each of the first base 11 and the second base 17.

Of course, in an alternative embodiment not shown in the drawings, the first recessed grooves 13 may be disposed only on upper and lower sides of the first base 11 or the second base 17, so as to increase the contact area between the lead frame and the molded structure 40.

As shown in FIGS. 3 and 5, in embodiment one of the present disclosure, the lead frame 10 further includes multiple indentations 14 arranged at intervals on a surface of the first base 11 facing the molded structure 40 and/or a surface of the second base 17 facing the molded structure 40, where the surface of the first base 11 and/or the surface of the second base 17 refers to an upper surface of the first base 11 and/or an upper surface of the second base 17 in a vertical direction in FIG. 3.

In the preceding technical scheme, multiple indentations 14 are disposed on the surface of the first base 11 and/or the surface of the second base 17 so that part of the molded structure 40 may be filled in the indentations 14, so as to increase the connection area between the lead frame 10 and the molded structure 40, thereby increasing the air tightness between the lead frame 10 and the molded structure 40. Further, the bonding force between the lead frame 10 and the molded structure 40 can be effectively increased.

Specifically, in embodiment one of the present disclosure, multiple indentations 14 are disposed on a side of the first base 11 facing the molded structure 40 and/or a side of the second base 17 facing the molded structure 40, where the side of the first base 11 facing the molded structure 40 and/or the side of the second base 17 facing the molded structure 40 refers to an upper side of the first base 11 and/or an upper side of the second base 17 in the vertical direction in FIG. 3.

Specifically, in embodiment one of the present disclosure, multiple indentations 14 are arranged at intervals on the surface of the first base 11 and/or the surface of the second base 17 in the first direction. Of course, in an alternative embodiment not shown in the drawings, multiple indentations 14 may be arranged at intervals on the surface of the first base 11 and/or the surface of the second base 17 in the second direction.

Specifically, as shown in FIG. 3, in embodiment one of the present disclosure, the molded structure includes a chip placement body 61 and a reflective structure surrounding an outer circumference of the chip placement body 61, where the chip placement body 61 defines the escape groove 62. The indentations 14 are disposed at a junction of the reflective structure and the lead frame 10, in an implementation, in a central region between the escape groove 62 and the edge of the lead frame 10.

In an implementation, the indentations 14 are grooves, which are convenient to machine. Of course, in an alternative embodiment not shown in the drawings, the indentations 14 may also be ribs, which is difficult to machine.

As shown in FIGS. 3 and 5, in embodiment one of the present disclosure, the indentations 14 extend in the second direction and are disposed at an end of the first base 11 and/or an end of the second base 17 away from the channel 12 in the first direction perpendicular to the extension direction of the channel 12.

In the preceding technical scheme, since a connection area between the end of the first base 11 or the end of the second base 17 away from the channel 12 and the molded structure 40 is relatively large, the indentations 14 are disposed at the end of the first body 11 or the end of the second body 17 away from the channel 12, so as to greatly increase the bonding force between the lead frame 10 and the molded structure 40 and reduce the deformation capability of the lead frame 10 at high temperature, thereby improving the reliability of the lead frame 10.

As shown in FIGS. 2 and 5, in embodiment one of the present disclosure, the lead frame 10 further includes a second recessed groove 15, where the second recessed groove 15 is disposed on the side of the first base 11 facing away from the channel 12, and/or the second recessed groove 15 is disposed on the side of the second base 17 facing away from the channel 12. The molded structure 40 further includes a first protrusion 64 connected to the reflective structure, where the second recessed groove 15 mates with the first protrusion 64 in shape and size.

In the preceding technical scheme, an inner wall of the second recessed groove 15 may be bonded to an outer wall of the first protrusion 64 so that the first base 11 and/or the second base 17 can be better bonded to the molded structure 40, thereby improving the connection stability between the pins and the molded structure and increasing the air tightness between the lead frame 10 and the molded structure 40.

In an implementation, the first base 11 is provided with the second recessed groove 15, the second base 17 is also provided with the second recessed groove 15, and each of the two second recessed grooves 15 is provided with the first protrusion 64.

As shown in FIG. 2, in embodiment one of the present disclosure, the second recessed groove 15 includes at least two groove segments that communicate with each other, where in the first direction, widths of the at least two groove segments decrease sequentially in a direction towards the channel 12.

Through the preceding arrangement, not only can the connection stability between the lead frame 10 and the molded structure 40 be effectively increased, but also the thermal deformation of the bulk copper layer during welding can be reduced, that is, the thermal deformation of the first base and/or the second base can be reduced, thereby improving the air tightness between the lead frame 10 and the molded structure 40.

Specifically, in embodiment one of the present disclosure, a ratio of widths of two adjacent groove segments is between 1 and 2.

As shown in FIG. 2, in embodiment one of the present disclosure, the at least two groove segments include a first groove segment 151, a second groove segment 152 and a third groove segment 153 that communicate sequentially, where a width of the first groove segment 151, a width of the second groove segment 152 and a width of the third groove segment 153 decrease sequentially in the direction towards the channel 12.

Through the preceding arrangement, not only can the connection stability between the lead frame 10 and the molded structure 40 be effectively increased, but also the connection strength between the pins and the bases can be increased, thereby avoiding the pins from being deformed.

In the preceding technical scheme, the width of the first groove segment 151, the width of the second groove segment 152 and the width of the third groove segment 153 decrease sequentially, thereby facilitating the machining of the lead frame.

It is to be noted that, in embodiment one of the present disclosure, the width of the first groove segment 151, the width of the second groove segment 152 and the width of the third groove segment 153 refer to a width of the first groove segment 151, a width of the second groove segment 152 and a width of the third groove segment 153 in the second direction.

Of course, in an alternative implementation not shown in the drawings, the width of the first groove segment 151 may be configured to be greater than the width of the second groove segment 152, and the width of the second groove segment 152 is less than the width of the third groove segment 153.

In an implementation, as shown in FIGS. 1, 2, 3 and 5, in embodiment one of the present disclosure, projections of the reflective structure and the chip placement body 61 on a first plane completely cover the first protrusion 64, so as to avoid the first protrusion 64 from being exposed from the escape groove 62.

It is to be noted that, in embodiment one of the present disclosure, the first plane refers to a plane shown in FIG. 1, that is, a paper surface in FIG. 1.

As shown in FIGS. 1 and 3, in embodiment one of the present disclosure, the molded structure 40 further includes a barrier 65 extending in the second direction and connected to the chip placement body 61, and the barrier 65 is disposed on a side of the escape groove 62 facing away from an internal through hole 74 and mates with the channel 12. In the vertical direction shown in FIG. 3, a width of an end of the barrier 65 closer to the internal through hole 74 is less than a width of an end of the barrier 65 facing away from the internal through hole 74.

It is to be noted that, in embodiment one of the present disclosure, the barrier 65 includes three barrier segments sequentially connected in the extension direction of the channel 12. In the extension direction of the channel 12, a width of each of barrier segments at two ends among the three barrier segments of the barrier 65 is greater than a width of a barrier segment in the middle among the three barrier segments of the barrier 65. In this manner, a width of a middle of the barrier 65 is relatively small and widths at two ends of the barrier 65 are relatively large, that is, the "wide-narrow-wide" pattern that can mate with the channel 12 in FIG. 1 can be formed.

In an implementation, the barrier 65 is "I-shaped" so that the barrier 65 can better mate with the channel 12.

In the preceding technical scheme, the barrier 65 is provided and mates with the channel 12 so that more connection area exists between the molded structure 40 and the lead frame 10, thereby improving the bonding force between the molded structure 40 and the lead frame 10. Further, an electroplating region between the chip 1 and the lead frame 10 can also be reduced so that not only can the reliability of high temperature aging be improved, but also a light-extraction rate of the LED device can be effectively improved.

As shown in FIGS. 1, 2 and 5, in embodiment one of the present disclosure, the lead frame 10 includes two first pins 20 spaced apart in the extension direction of the channel 12.

In the preceding technical scheme, the two first pins 20 are provided so that the possibility that the flux intrudes into a functional region of the LED device from the pins can be reduced, thereby avoiding damage to the LED device and improving the reliability of the LED device.

Of course, in an alternative embodiment not shown in the drawings, the number of the first pins 20 may be three or four or the like.

As shown in FIGS. 1, 2 and 5, in embodiment one of the present disclosure, the lead frame 10 includes two second pins 30 spaced apart in the extension direction of the channel 12.

Of course, in an alternative embodiment not shown in the drawings, the number of the second pins 30 may be three or four or the like.

As shown in FIG. 2, in embodiment one of the present disclosure, the molded structure 40 includes second arc structures 42 connected to the first pins 20 of the lead frame 10 and at least one side of the first pin 20 is provided with the second arc structure; and the molded structure 40 includes third arc structures 43 connected to the second pins 30 of the lead frame 10 and at least one side of the second pin 30 is provided with the third arc structure.

Through the preceding arrangement, the concentrated stress at positions where the first pins 20 and the second pins 30 are connected to the molded structure 40 separately can be reduced, thereby improving the connection stability between the first pins 20 and the second pins 30 and the molded structure 40. Further, the preceding arrangement facilitates the demolding of the molded structure 40.

In an implementation, as shown in FIG. 2, in embodiment one of the present disclosure, the second arc structure 42 is disposed on each of two opposite sides of the first pin 20.

Of course, in an alternative embodiment not shown in the drawings, the second arc structure 42 may be provided on only one side of the first pin 20.

In an implementation, as shown in FIG. 2, in embodiment one of the present disclosure, the third arc structure 43 is disposed on each of two opposite sides of the second pin 30.

Of course, in an alternative embodiment not shown in the drawings, the third arc structure 43 may be provided on only one side of the second pin 30.

As shown in FIGS. 1 and 3, embodiment one of the present disclosure provides an LED device including the bracket and the chip 1. Specifically, the molded structure 40 includes the chip placement body 61 and the reflective structure. The chip placement body 61 defines the escape groove 62. The reflective structure is a tubular structure 70 with the internal through hole 74. The inner through hole 74 communicates with the escape groove 62. The tubular structure 70 surrounds the outer circumference of the chip placement body 61. An opening that communicates with the internal through hole 74 is formed at a first end of the tubular structure 70, and a second end of the tubular structure 70 is connected to the chip placement body 61 along an entire circumferential direction. A circumferential sidewall of the internal through hole 74 is formed with a reflective surface for reflecting light. From the second end to the first end of the tubular structure 70, the reflective surface includes multiple arc surfaces sequentially connected.

In the preceding technical scheme, the reflective structure extends along the circumferential direction and is connected to the chip placement body 61 along the entire circumferential direction so that the reflective structure can have a relatively large reflective surface, that is, the outside of the chip placement body 61 is the reflective structure. In this manner, the large-area reflective surface may reflect the light emitted by the chip on the chip placement body 61, thereby effectively improving the light-extraction rate.

It is to be noted that, in embodiment one of the present disclosure, the first end refers to an upper end of the reflective structure in FIG. 3. Since the reflective structure extends along the circumferential direction, the first end also extends along the circumferential direction. The second end refers to a lower end of the reflective structure in FIG. 3, that is, an end of the reflective structure closer to the chip placement body 61, and similarly, the second end also extends along the circumferential direction.

Specifically, the reflective surface includes multiple arc surfaces sequentially connected. At the same height in FIG. 3, each of the multiple arc surfaces has a larger area than a flat surface. In this manner, an area of the reflective surface can be effectively increased so that the reflective surface can better reflect the light emitted by the chip 1, thereby effectively improving the light-extraction rate.

Figure 16:
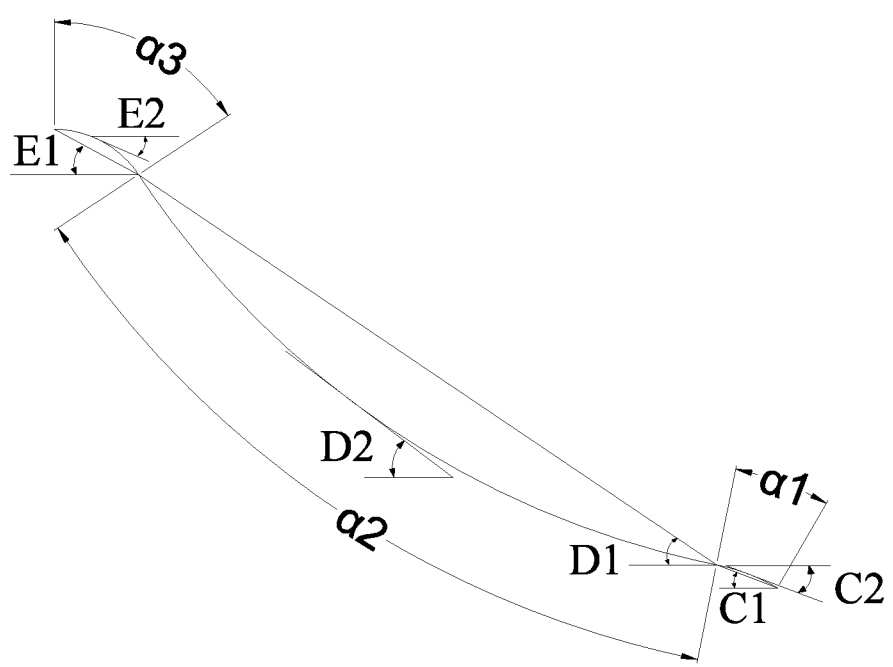
FIG. 16 is an enlarged view of a dotted line area A in FIG. 3 according to embodiment one of the present disclosure.

As shown in FIG. 3 and FIG. 16, in embodiment one of the present disclosure, the multiple arc surfaces include a first arc surface 71 and a second arc surface 72 connected to each other, where the first arc surface 71 and the second arc surface 72 are both inclined relative to a horizontal plane, and the first arc surface 71 and the second arc surface 72 are both inclined towards a direction gradually away from a centerline of the tubular structure 70.

Through the preceding arrangement, the reflective structure may form the tubular structure 70 with an upward opening, that is, a bowl-shaped structure. In this manner, not only can the reflective surface face the chip 1 so that the light emitted by the chip 1 can be irradiated on the reflective surface, but also the reflective surface can face the top of the chip 1 so that the reflective surface reflects the light emitted by the chip 1 towards a direction away from the chip 1. In this manner, the reflective effect of the reflective structure can be effectively improved.

As shown in FIG. 3 and FIG. 16, in embodiment one of the present disclosure, a first included angle C1 exists between the first arc surface 71 and the horizontal plane and satisfies that $25°\leq C1 \leq 50°$.

Through the preceding arrangement, the first arc surface 71 extends in a direction away from the chip placement body 61 first, thereby reducing the overall inclination of the reflective surface, increasing an area of the reflective surface in a horizontal direction in FIG. 3, and reducing a height of the reflective surface in the vertical direction in FIG. 3. In this manner, the reflective surface can reflect the light emitted by the chip 1 towards the direction away from the chip 1.

As shown in FIG. 3 and FIG. 16, in embodiment one of the present disclosure, a second included angle D1 exists between the second arc surface 72 and the horizontal plane and satisfies that $30°\leq D1 \leq 45°$.

Through the preceding arrangement, the second arc surface 72 extends upward in the vertical direction in FIG. 3 to form the tubular structure 70, thereby avoiding the reflected light from diffusing to the surrounding and improving the light-extraction rate of the LED device.

As shown in FIG. 3 and FIG. 16, in embodiment one of the present disclosure, the first arc surface 71 protrudes towards a side where the centerline is located and has a first radian $\alpha 1$, where the first radian $\alpha 1$ is greater than or equal to 10° and less than or equal to 30°.

Through the preceding arrangement, in the case where the overall inclination of the reflective surface is reduced and the first arc surface 71 extends in the direction away from the chip placement body 61, an area of the first arc surface 71 is increased, thereby increasing the area of the reflective surface and effectively improving the reflective effect of the reflective structure.

As shown in FIG. 3 and FIG. 16, in embodiment one of the present disclosure, the second arc surface 72 protrudes towards a direction facing away from the centerline and has a second radian $\alpha 2$, where the second radian $\alpha 2$ is greater than or equal to 40° and less than or equal to 80°. Similarly, the second arc surface 72 can achieve the same effect as the first arc surface 71, which is not repeated here.

As shown in FIG. 3 and FIG. 16, in embodiment one of the present disclosure, a first included angle C2 exists between the first arc surface 71 and the horizontal plane and first increases and then decreases in a direction away from the centerline, and a second included angle D2 exists between the second arc surface 72 and the horizontal surface and gradually increases in the direction away from the centerline.

Through the preceding arrangement, the first arc surface 71 protrudes towards the side where the centerline is located and the second arc surface 72 protrudes towards the direction facing away from the centerline so that the area of the first arc surface 71 and the area of the second arc surface 72 can be increased, thereby increasing the area of the reflective surface and improving the reflective effect of the reflective structure.

As shown in FIG. 3 and FIG. 16, in embodiment one of the present disclosure, the multiple arc surfaces further include a third arc surface 73 connected to the second arc surface 72, where the third arc surface 73 is inclined relative to the horizontal plane, and the third arc surface 73 may be inclined towards the direction gradually away from the centerline of the tubular structure 70.

In the preceding technical scheme, the third arc surface 73 is added on the basis of the two arc surfaces, thereby further increasing a reflective area of the reflective structure and better improving the light-extraction rate of the LED device.

As shown in FIG. 3 and FIG. 16, in embodiment one of the present disclosure, a third included angle E1 exists between the third arc surface 73 and the horizontal plane and satisfies that 30°≤E1≤40°.

Through the preceding arrangement, not only can the area of the reflective surface in the vertical direction be increased, but also the area of the reflective surface in the horizontal direction can be increased, so as to form the bowl-shaped structure shown in FIG. 3, thereby better reflecting the light emitted by the chip 1 and improving the light-extraction rate.

It is to be noted that, in embodiment one of the present disclosure, the first included angle C1 refers to an angle between a line connecting two ends of an arc projected by the first arc surface 71 on the paper surface in FIG. 3 and FIG. 16 and the horizontal plane. The second included angle D1 and the third included angle E1 can be obtained in the same manner, which is not repeated here.

As shown in FIG. 3 and FIG. 16, in embodiment one of the present disclosure, the third arc surface 73 protrudes towards the side where the centerline is located and has a third radian α3, where the third radian α3 is greater than or equal to 40° and less than or equal to 80°. Similarly, the third arc surface 73 can achieve the same effect as the first arc surface 71 and the second arc surface 72, which is not repeated here.

It is to be noted that the first radian, the second radian and the third radian in the embodiment of the present disclosure refer to values of central angles corresponding to the first arc surface 71, the second arc surface 72 and the third arc surface 73, separately. For example, the first radian refers to a value of a central angle corresponding to an arc of the first arc surface 71 on a section shown in FIG. 3. Similarly, a calculation method of a value of the second radian and a value of the third radian is the same as that of the first radian.

In an implementation, as shown in FIG. 3 and FIG. 16, in embodiment one of the present disclosure, the reflective surface includes the first arc surface 71, the second arc surface 72 and the third arc surface 73 sequentially connected. The first included angle C2 exists between the first arc surface 71 and the horizontal plane, the second included angle D2 exists between the second arc surface 72 and the horizontal plane, and a third included angle E2 exists between the third arc surface 73 and the horizontal plane, where in the direction away from the centerline, the first included angle C2 first increases and then decreases, the second included angle D2 gradually increases, and the third included angle E2 gradually decreases.

Through the preceding arrangement, the first arc surface 71 protrudes towards the side where the centerline is located, the second arc surface 72 protrudes towards the direction facing away from the centerline, and the third arc surface 73 protrudes towards the side where the centerline is located so that the area of the first arc surface 71, the area of the second arc surface 72 and the area of the third arc surface 73 can be increased, thereby increasing the area of the reflective surface and improving the reflective effect of the reflective structure.

It is to be noted that, in embodiment one of the present disclosure, the first included angle C2 refers to an included angle between a tangent plane of the first arc surface 71 and the horizontal plane. For example, the first included angle C2 is an included angle between a tangent at any point of the arc of the first arc surface 71 on the section shown in FIG. 3 and the horizontal plane. The second included angle D2 and the third included angle E2 can be obtained in the same manner, which is not repeated here.

Figure 4:
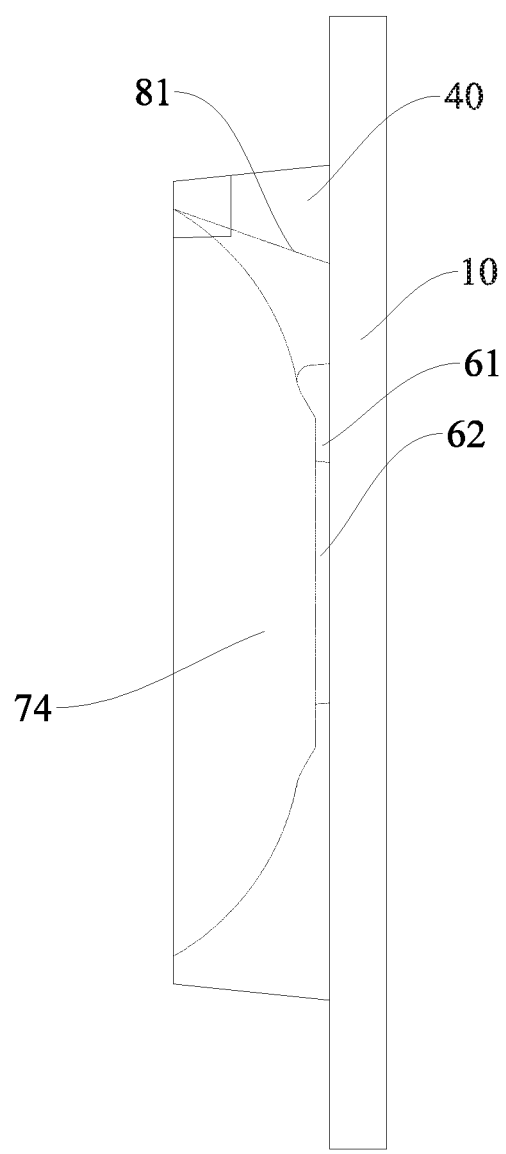
FIG. 4 is a right view of the bracket in FIG. 1.

As shown in FIGS. 3 and 4, in embodiment one of the present disclosure, the chip placement body 61 is a step structure for mounting the chip.

In the preceding technical scheme, the chip placement body 61 is configured to be the step structure, so as to raise a welding height of the chip 1 and reduce an area of a metal layer (an upper surface of the lead frame 10) at a bottom of the chip 1; and the bottom of the chip 1 may be close to the molded structure 40, so as to avoid the problem that the light emitted from four sides of the chip 1 is reflected to the bottom of the chip 1 through the metal layer (the upper surface of the lead frame 10), resulting in a decrease in brightness. In this manner, the light extraction of the product can be improved.

Further, the step structure can position the chip 1 so that the chip 1 is mounted in a relatively central position of the reflective structure. In this manner, the distance between the reflective surface and the chip 1 along the circumferential direction is the same, thereby improving the uniformity of light reflection by the reflective structure and improving the uniformity of the light extraction of the LED device.

Further, the step structure is provided, so as to raise the chip 1 and avoid the uneven solder paste between the chip 1 and the lead frame 10 from supporting the chip 1, thereby avoiding the problem of uneven installation of the chip 1 and avoiding the problem that the light emitted from four sides of the chip 1 is reflected to the bottom of the chip 1 through the metal layer (the upper surface of the lead frame 10), resulting in a decrease in brightness.

As shown in FIGS. 3 and 4, in embodiment one of the present disclosure, 0.7W0≤W1≤0.9W0, where W0 represents a width of the chip 1, and W1 represents a width of the escape groove 62. In this manner, the step structure can support the chip 1, and the escape groove 62 can avoid the solder paste.

As shown in FIGS. 3 and 4, in embodiment one of the present disclosure, 0.15H0≤H1≤0.35H0, where H0 represents a height of the chip 1, and H1 represents a height of the step structure. In this manner, the following can be avoided: the height of the step structure is too low, causing the solder paste to protrude from the step structure and causing the chip 1 to be mounted unevenly; and the following can be avoided: the height of the step structure is too high so that an installation height of the chip 1 is too high and the reflective surface of the reflective structure cannot be fully utilized for light extraction.

In an implementation, 0.03 mm≤H1≤0.08 mm, where H1 represents a height of the step structure.

In an implementation, a distance at which the chip 1 protrudes from the step structure is 100 μm to 250 μm.

As shown in FIG. 1, in the embodiment of the present disclosure, the LED device further includes at least one accommodation groove 80 disposed on an inner wall surface of the tubular structure 70 and used for accommodating a Zener tube, where the accommodation groove 80 communicates with the inner through hole 74.

Through the preceding arrangement, the accommodation groove 80 can accommodate the Zener tube, which is convenient for the machining personnel to mount the Zener tube on the molded structure and connect the Zener tube to the lead frame 10, thereby improving the production efficiency of the LED device.

Specifically, in the embodiment of the present disclosure, the accommodation groove 80 is a through groove so that the Zener tube can be connected to the lead frame 10.

In an implementation, one accommodation groove 80 is provided, where an end of the accommodation groove 80 is used for placing the Zener tube, and the other end of the accommodation groove 80 is used for bonding wires.

In an implementation, the accommodation groove 80 is a rectangle. Of course, in an alternative embodiment not shown in the drawings, the accommodation groove 80 may also be a square or another shape capable of accommodating the Zener tube.

As shown in FIGS. 1 and 4, in the embodiment of the present disclosure, an inclined surface 81 is provided on a sidewall of the accommodation groove 80 farther from the chip placement body 61, where from the second end to the first end of the tubular structure 70, the inclined surface 81 is gradually away from a centerline of the inner through hole 74.

Specifically, an angle between the inclined surface 81 and the horizontal plane is greater than or equal to 70° and less than or equal to 80°.

Through the preceding arrangement, the inclined surface 81 faces the top of the chip 1 so that the inclined surface 81 reflects the light emitted by the chip 1 towards the direction away from the chip 1, thereby effectively improving the reflective effect of the molded structure. Of course, in an alternative embodiment, the inclined surface 81 may face the chip 1 so that the light emitted by the chip 1 is irradiated on the inclined surface 81.

As shown in FIGS. 1 and 4, in the embodiment of the present disclosure, the inclined surface 81 extends from the sidewall of the accommodation groove 80 to a first end of a reflective portion.

Through the preceding arrangement, an area of the inclined surface 81 can be increased, thereby increasing the reflective area of the reflected light and improving the reflective effect of the inclined surface 81. Further, through the preceding arrangement, it is beneficial to the die bonding and subsequent wire bonding operations of the Zener tube.

Of course, in an alternative embodiment, the molded structure may include multiple accommodation grooves 80 arranged at intervals along a circumferential direction of the escape groove 62. In this manner, the multiple accommodation grooves 80 may be provided with multiple Zener tubes, thereby increasing the voltage regulation capability and the antistatic capability of the LED device.

Of course, in an alternative embodiment, the molded structure may further include two accommodation grooves 80 symmetrically arranged about the escape groove 62 or adjacently arranged at intervals along the circumferential direction of the escape groove 62.

As shown in FIG. 1, in the embodiment of the present disclosure, the accommodation groove 80 and the escape groove 62 are arranged at intervals.

Through the preceding arrangement, an interval between the accommodation groove 80 and the escape groove 62 is filled by the reflective portion, and the reflective portion can play a role of reflection so that in the case where the accommodation groove 80 is provided, a reflective area of the reflective portion can be ensured as much as possible, thereby ensuring the reflective effect of the reflective portion.

It is to be noted that, in the embodiment of the present disclosure, the interval is provided, which means that the accommodation groove 80 does not communicate with the escape groove 62.

In the embodiment of the present disclosure, the LED device further includes a reflector covering the accommodation groove 80 and used for reflecting light.

In the preceding technical scheme, the reflector is provided so that the reflective area of the reflected light can be increased, so as to avoid the problem of reduced light efficiency due to light absorption by the lead frame 10 exposed by the Zener tube and the accommodation groove 80, thereby effectively improving the light-extraction rate of the LED device.

Specifically, in the embodiment of the present disclosure, after the Zener tube is mounted in the accommodation groove 80, then the reflector covers the accommodation groove 80 and the Zener tube. In this manner, in the case where the Zener tube is provided, the reflective area of the molded structure 40 can still be ensured.

Specifically, in the embodiment of the present disclosure, the reflector covers the entire accommodation groove 80, and after the reflector is filled, an upper surface of the reflector almost matches the curvature of the original reflective surface so as to form a continuous smooth surface.

In an implementation, the reflector is made of highly reflective powder and colloidal material. That is, the accommodation groove 80 is filled with the highly reflective powder and colloid, and the highly reflective powder and colloid cover the Zener tube.

Specifically, the colloidal material may be formed of epoxy resin, silicone resin, or silica gel. The highly reflective powder may include ceramic powder with high reflectivity, such as $TiO_2$, $Al_2O_3$, $Nb_2O_5$, or ZnO, or may include metal powder with high reflectivity (for example, metal powder such as Al or Ag).

Embodiment Two

Figure 6:
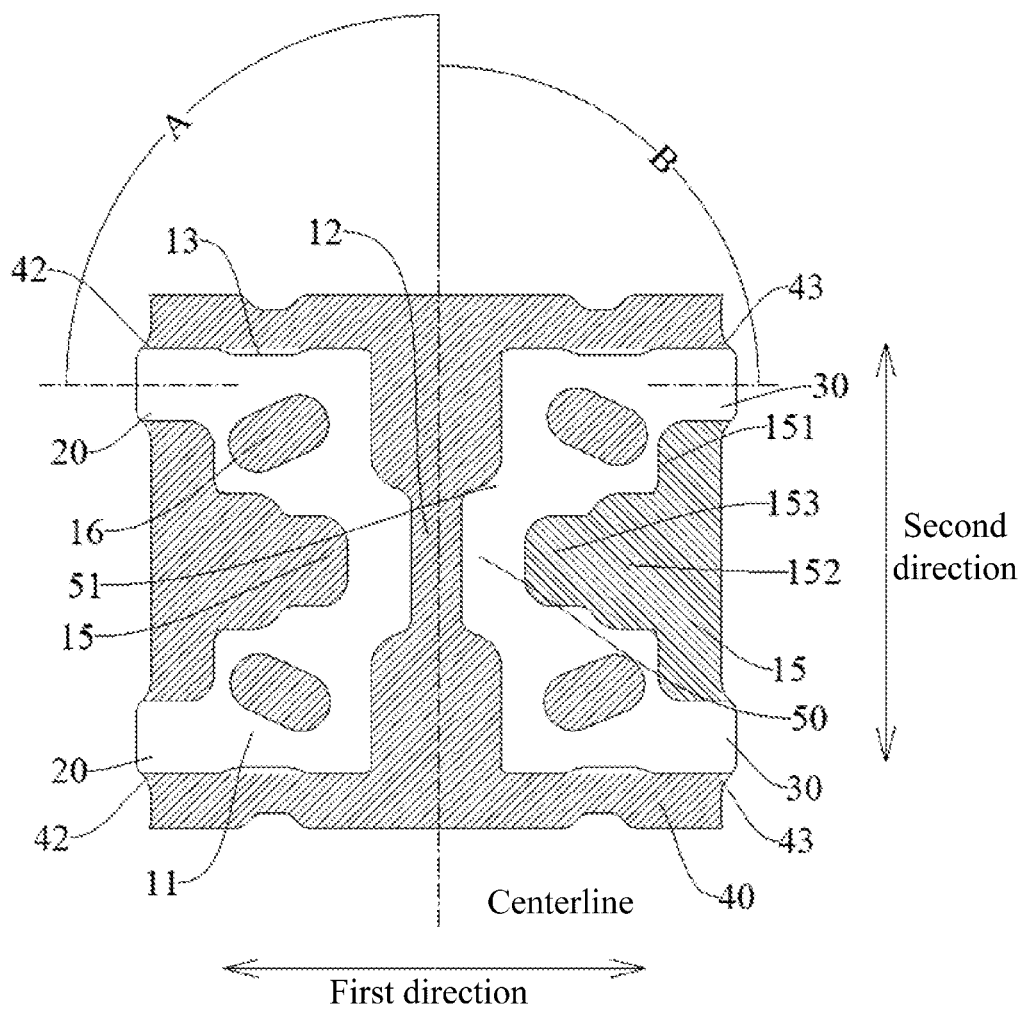
FIG. 6 is a structural diagram of a bracket according to embodiment two of the present disclosure.

As shown in FIG. 6, the difference between embodiment two and embodiment one of the present disclosure is that, in embodiment two, the included angle exists between the length direction of the elongated hole and the extension direction of the channel 12, and a distance between a lower end of the elongated hole and a centerline of the channel 12 is greater than a distance between an upper end of the elongated hole and the centerline of the channel 12. In this manner, the connection area between the lead frame 10 and the molded structure 40 can be increased, thereby increasing the bonding force between the lead frame 10 and the molded structure 40.

Other structures of the bracket in embodiment two of the present disclosure are the same as those in embodiment one and not repeated here.

Embodiment Three

Figure 7:
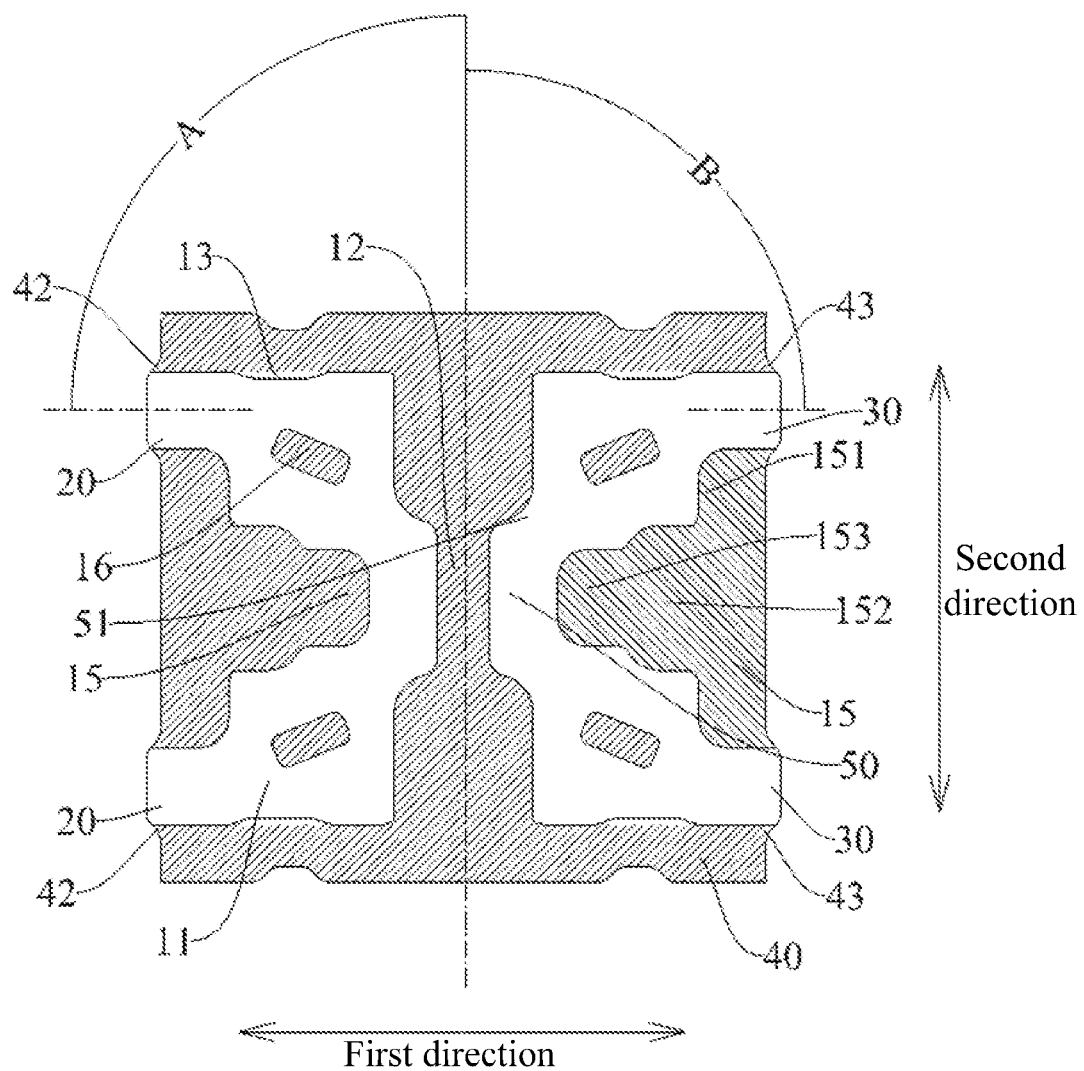
FIG. 7 is a structural diagram of a bracket according to embodiment three of the present disclosure.

As shown in FIG. 7, the difference between embodiment three and embodiment one of the present disclosure is that, in embodiment three, the through hole 16 is a square through hole with rounded corners, thereby increasing the connection area between the lead frame 10 and the molded structure 40 and increasing the bonding force between the lead frame 10 and the molded structure 40.

Other structures of the bracket in embodiment three of the present disclosure are the same as those in embodiment one and not repeated here.

Embodiment Four

Figure 8:
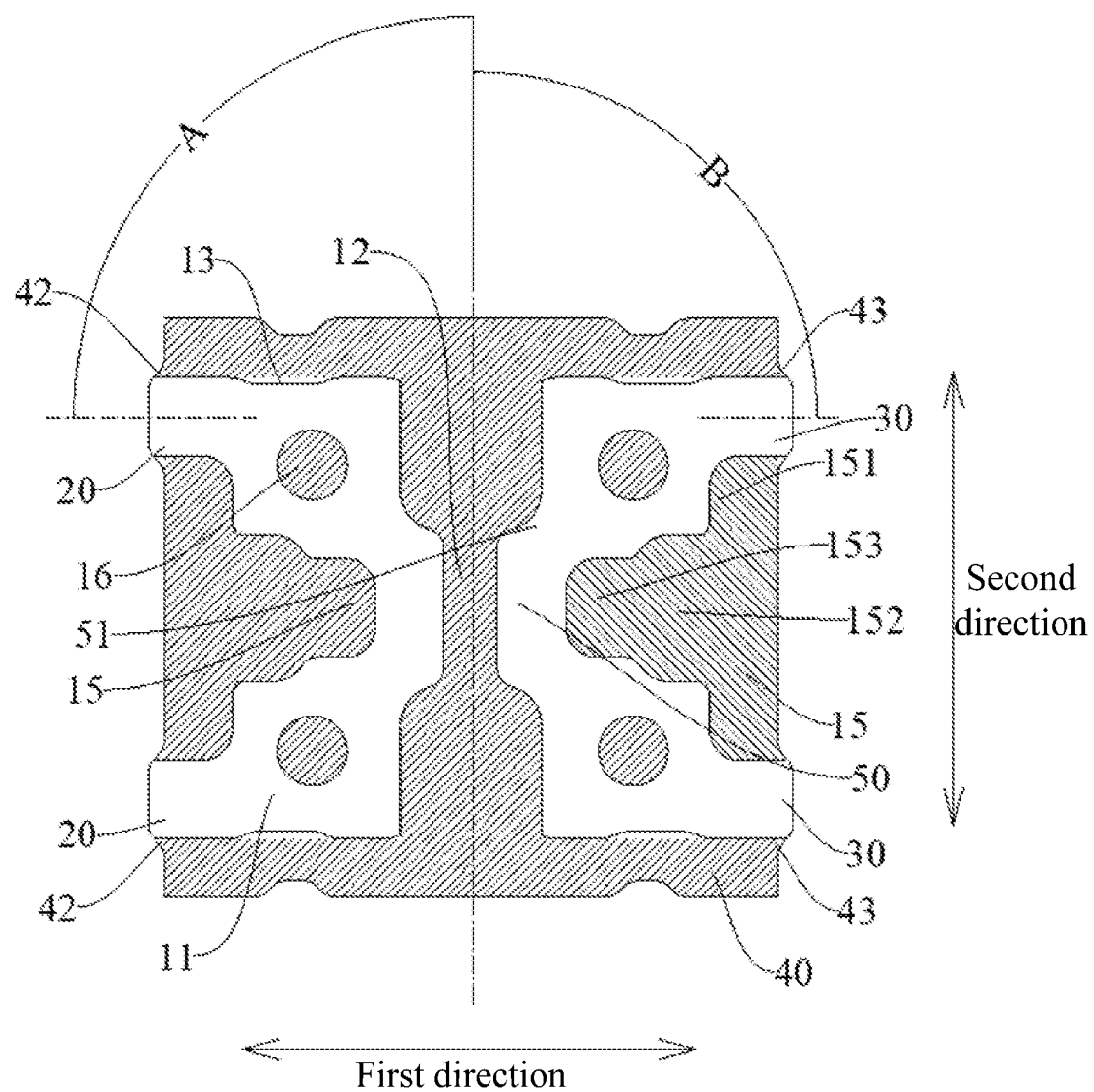
FIG. 8 is a structural diagram of a bracket according to embodiment four of the present disclosure.

As shown in FIG. 8, the difference between embodiment four and embodiment one of the present disclosure is that, in embodiment four, the through hole 16 is a circular through hole, thereby increasing the connection area between the lead frame 10 and the molded structure 40 and increasing the bonding force between the lead frame 10 and the molded structure 40. Further, compared with the elongated hole, the circular through hole is simpler in structure and convenient to machine.

Other structures of the bracket in embodiment four of the present disclosure are the same as those in embodiment one and not repeated here.

Embodiment Five

Figure 9:
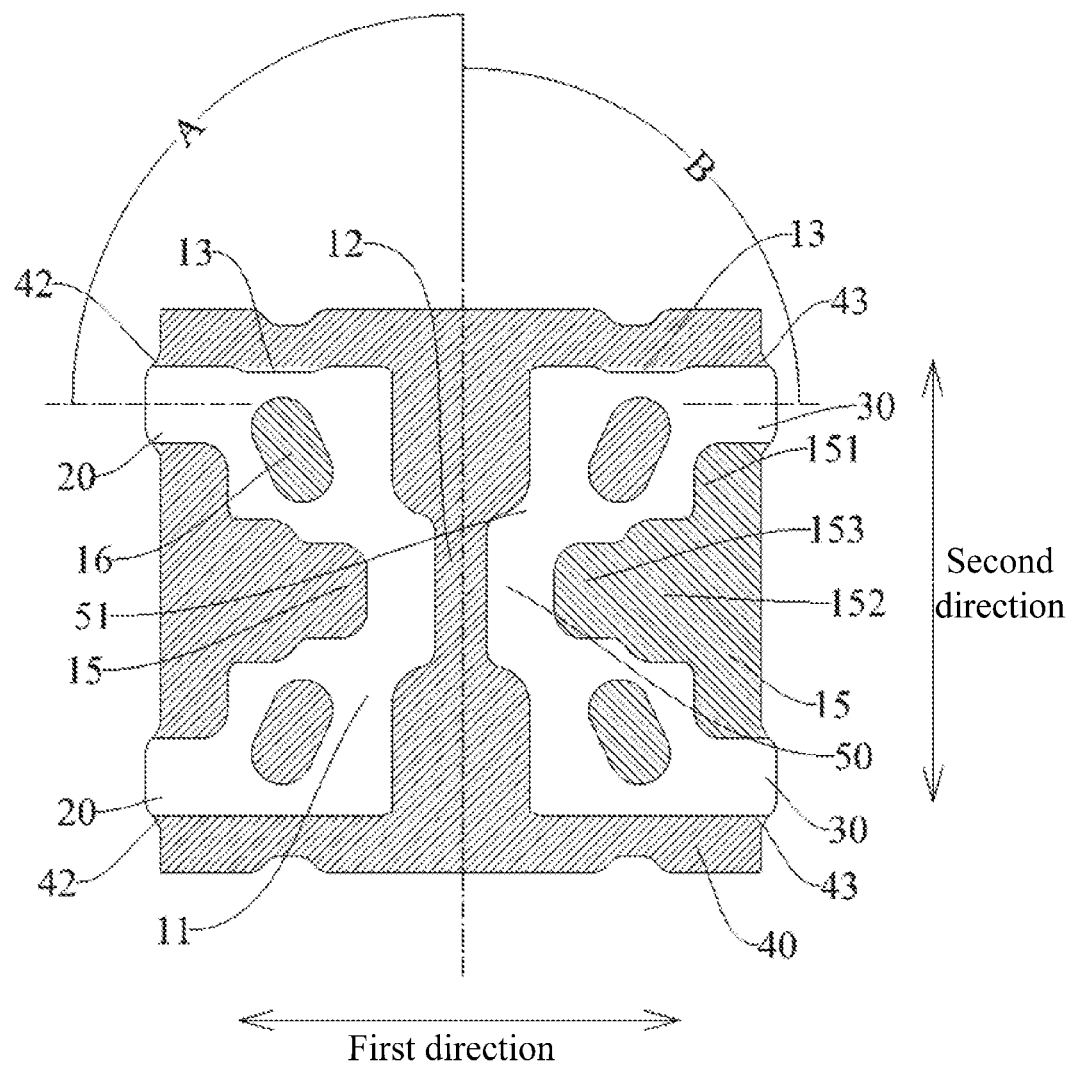
FIG. 9 is a structural diagram of a bracket according to embodiment five of the present disclosure.

As shown in FIG. 9, the difference between embodiment five and embodiment one of the present disclosure is that, in embodiment five, in the extension direction (that is, the second direction) of the channel 12, the first recessed groove 13 is disposed on only one side of the first base 11 and one side of the second base 17 and not disposed on the other side of the first base 11 and the other side of the second base 17, thereby effectively increasing the air tightness between the lead frame 10 and a part to be connected. Further, the bonding force between the lead frame 10 and the part to be connected can also be effectively increased.

Other structures of the bracket in embodiment five of the present disclosure are the same as those in embodiment one and not repeated here.

Embodiment Six

Figure 10:
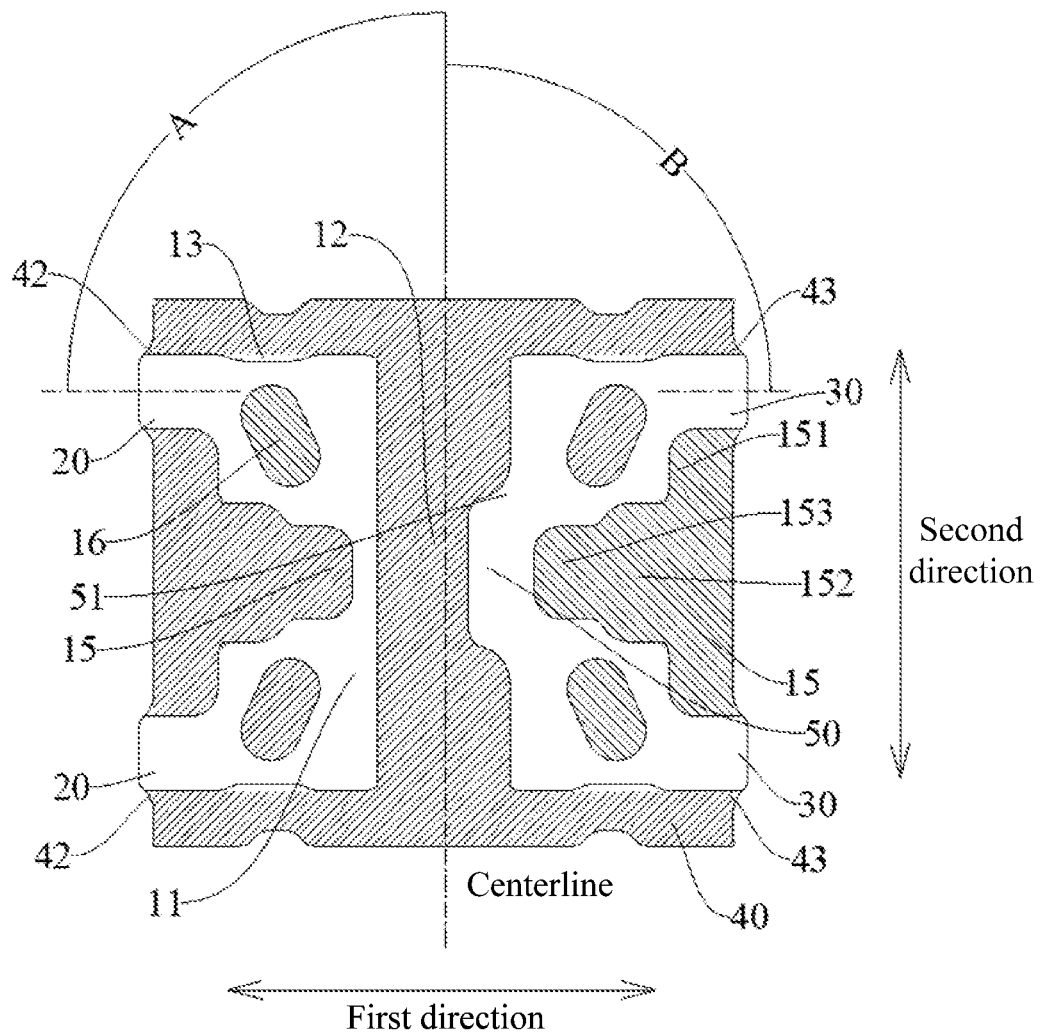
FIG. 10 is a structural diagram of a bracket according to embodiment six of the present disclosure.

As shown in FIG. 10, the difference between embodiment six and embodiment one of the present disclosure is that, in embodiment six, the barrier structure 50 is disposed on a side of the first base 11 or a side of the second base 17 facing the channel 12. In this manner, the width at each of two opposite ends of the channel 12 may be greater than the width of the middle part, so as to form the "wide-narrow-wide" pattern. In this manner, sufficient welding area can be provided for the welding between the lead frame 10 and the chip 1, and the possibility that flux intrudes into a chip placement region can be reduced. Therefore, the problem of the reduced air tightness caused by the thermal deformation of the lead frame 10 during welding can be avoided, thereby improving the reliability of the LED device.

Other structures of the bracket in embodiment six of the present disclosure are the same as those in embodiment one and not repeated here.

Embodiment Seven

Figure 11:
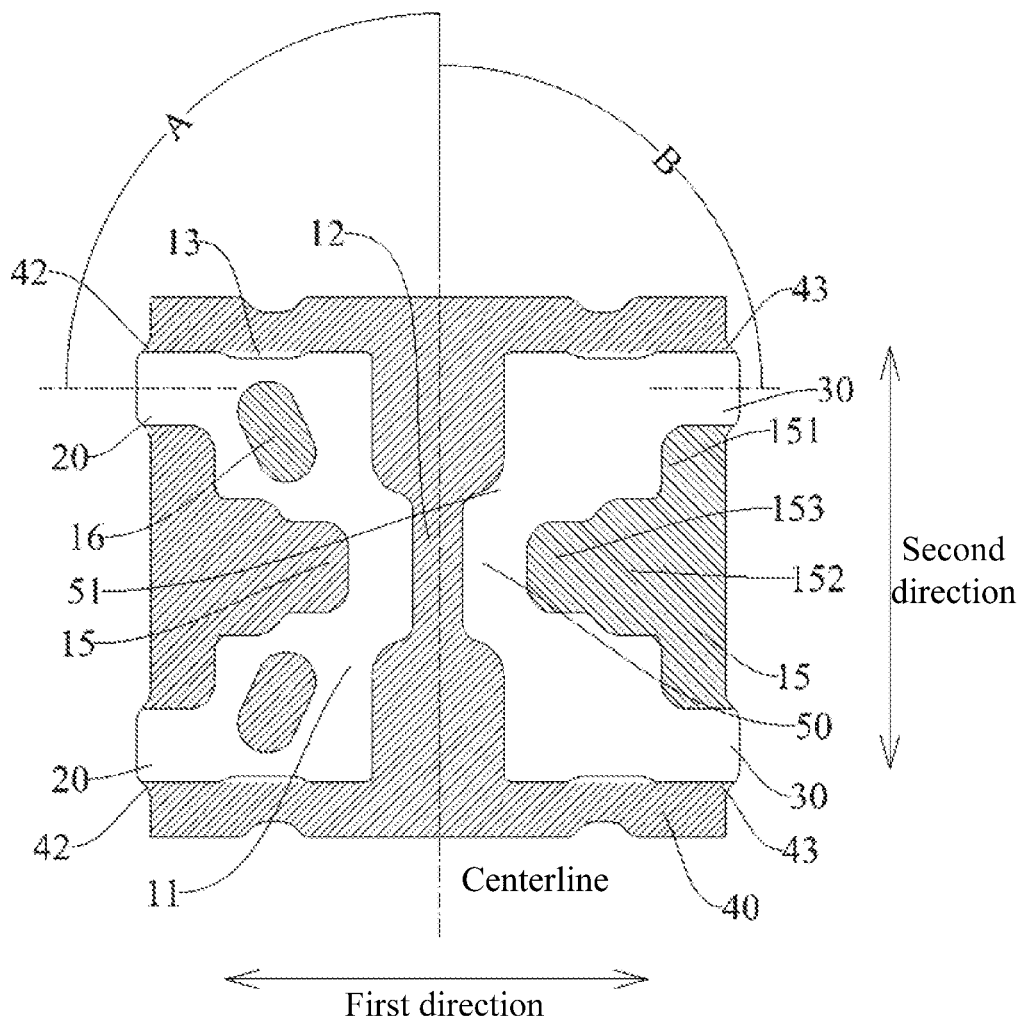
FIG. 11 is a structural diagram of a bracket according to embodiment seven of the present disclosure.

As shown in FIG. 11, the difference between embodiment seven and embodiment one of the present disclosure is that, in embodiment seven, the through hole 16 is disposed on the first base 11 or the second base 17. In this manner, the inner wall of the through hole 16 may be bonded to the molded structure 40 so as to improve the connection area between the lead frame 10 and the molded structure 40 and increase the bonding force between the lead frame 10 and the molded structure 40.

Other structures of the bracket in embodiment seven of the present disclosure are the same as those in embodiment one and not repeated here.

Embodiment Eight

Figure 12:
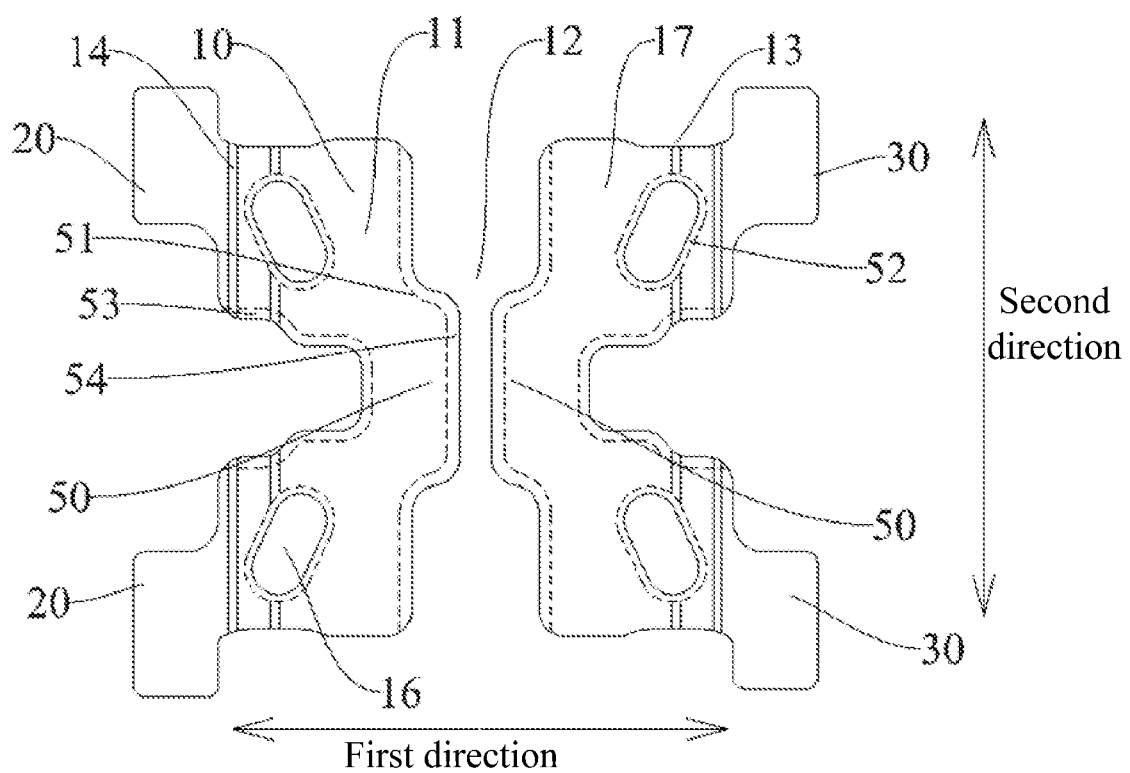
FIG. 12 is a structural diagram of a lead frame of a frame according to embodiment eight of the present disclosure.

As shown in FIG. 12, the difference between embodiment eight and embodiment one of the present disclosure is that, in embodiment eight, the extension direction of the first pins 20 is parallel to the extension direction of the channel 12, and the extension direction of the second pins 30 is parallel to the extension direction of the channel 12. The preceding arrangement is simple in structure, thereby facilitating machining.

Embodiment Nine

Figure 13:
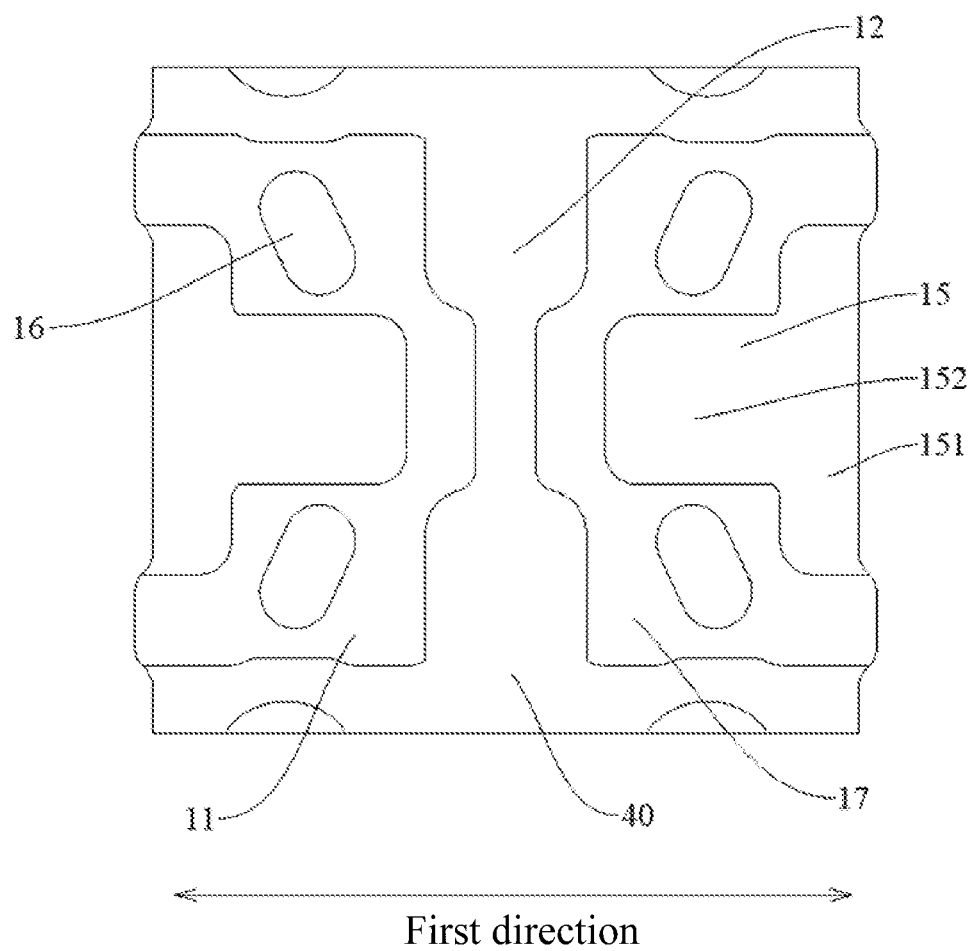
FIG. 13 is a structural diagram of a bracket according to embodiment nine of the present disclosure.

As shown in FIG. 13, the difference between embodiment nine and embodiment one of the present disclosure is that, in embodiment nine, the second recessed groove 15 includes only the first groove segment 151 and the second groove segment 152 that communicate with each other, and in the first direction, in a direction towards the channel 12, widths of the two groove segments decrease sequentially.

Through the preceding arrangement, the plastic fluidity of the molded structure 40 during injection molding can be improved, the inside of the injection molding of the bracket is fuller, and the possibility of generating air bubbles is reduced.

Other structures of the bracket in embodiment nine of the present disclosure are the same as those in embodiment one and not repeated here.

Embodiment Ten

Figure 14:
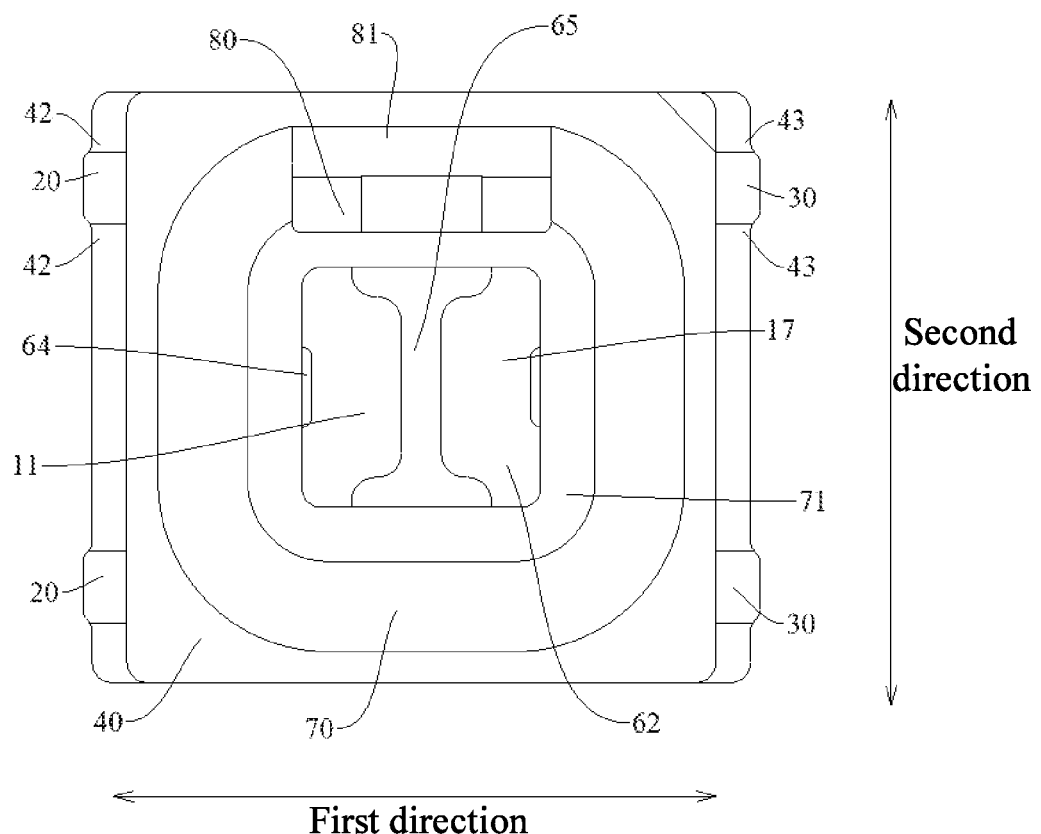
FIG. 14 is a structural diagram of a bracket according to embodiment ten of the present disclosure.
Figure 15:
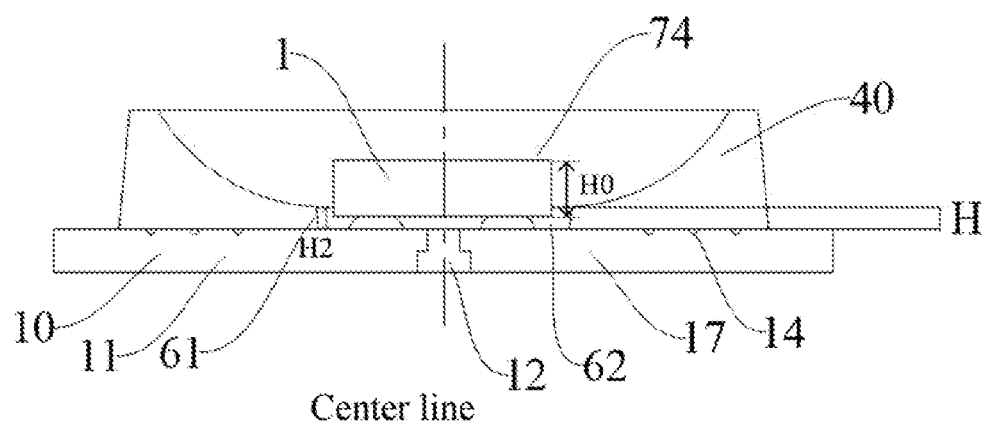
FIG. 15 is a structural diagram of an LED device according to embodiment ten of the present disclosure.

As shown in FIGS. 14 and 15, the difference between embodiment ten and embodiment one of the present disclosure is that, in embodiment ten, the chip placement body 61 is not a step structure for mounting the chip 1, the chip 1 is mounted in the escape groove 62, and projections of the reflective structure and the chip placement body 61 on the first plane partially cover the first protrusion 64 so that part of the first protrusion 64 is exposed from the escape groove 62.

The preceding structure is simple and convenient to machine, thereby reducing the machining cost.

In an implementation, a length value of the escape groove 62 is less than 1.2 times a length value of the chip 1 and greater than the length value of the chip 1. In this manner, a certain distance exists between an inner wall surface of the escape groove 62 and the chip 1 so that a sidewall of the escape groove 62 can be avoided from affecting the light extraction from the side of the chip 1, and the light emitted by the chip 1 can be reflected by the sidewall of the escape groove 62, thereby improving the light extraction effect.

As shown in FIGS. 14 and 15, in embodiment ten of the present disclosure, a depth of the escape groove 62 is H2, and a height of the chip 1 is H0, where the depth H satisfies that $0.15H0 \le H2 \le 0.5\ H0$. In this manner, most of the chip 1 may be configured to protrude from the escape groove 62 so that the depth of the escape groove 62 can be prevented from being too large and affecting the light extraction from the side of the chip 1, and most of the light emitted by the chip 1 is reflected by the reflective surface, thereby improving the light extraction effect.

Specifically, in embodiment ten of the present disclosure, an exposed length of the first protrusion 64 in the second direction is 0.2 to 0.6 times a length of the escape groove 62, and an exposed length of the first protrusion 64 in the first direction is 0.3 to 0.5 times a width of a middle part of the barrier 65.

In an implementation, the exposed length of the first protrusion 64 in the second direction is 0.36 mm, and the exposed length of the first protrusion 64 in the first direction is 0.04 mm.

Other structures of the bracket in embodiment ten of the present disclosure are the same as those in embodiment one and not repeated here.

In the preceding description, it can be seen that embodiment one of the present disclosure achieves the following technical effects: multiple first pins are disposed on a side of the first base facing away from the channel, multiple second pins are disposed on a side of the second base facing away from the channel, and each of the extension direction of the first pins and the extension direction of the second pins is arranged at an angle with the extension direction of the channel; in this manner, the multiple first pins are disposed on the same side of the first base, the multiple second pins are disposed on the same side of the second base, and the first pins and the second pins are disposed on different sides of the lead frame, that is, the pins with the same electrical polarity may be disposed on the same side of the lead frame, thereby facilitating the subsequent test performed by the technician on the LED device.

It is to be noted that the preceding are only preferred embodiments of the present disclosure and technical principles used therein. It is to be understood by those skilled in the art that the present disclosure is not limited to the specific embodiments described herein. For those skilled in the art, various apparent modifications, adaptations, combinations and substitutions can be made without departing from the scope of the present disclosure. Therefore, while the present disclosure is described in detail through the preceding embodiments, the present disclosure is not limited to the preceding embodiments and may include more other equivalent embodiments without departing from the concept of the present disclosure. The scope of the present disclosure is determined by the scope of the appended claims.

What is claimed is:

1. A bracket, comprising: a lead frame and a molded structure connected to the lead frame, wherein the lead frame comprises:
    a first lead portion comprising a first base;
    a second lead portion comprising a second base spaced from the first base, wherein a gap between the first base and the second base forms a channel, the first lead portion and the second lead portion are insulated from each other, and part of the molded structure is filled in the channel; and
    at least one barrier structure, wherein
        one barrier structure is disposed on a side of the first base facing the channel and between two opposite ends of the first base in an extension direction of the channel and protrudes from the first base;
        one barrier structure is disposed on a side of the second base facing the channel and between two opposite ends of the second base in an extension direction of the channel and protrudes from the second base; or
        one barrier structure is disposed on a side of the first base facing the channel and between two opposite ends of the first base in an extension direction of the channel and protrudes from the first base, and one barrier structure is disposed on a side of the second base facing the channel and between two opposite ends of the second base in the extension direction of the channel and protrudes from the second base;
    wherein a length between two opposite ends of the channel is greater than a length of a middle part of the channel so that a "wide-narrow-wide" pattern is formed; and
    wherein a width of each of the at least one barrier structure is greater than or equal to 0.25 times a width of the first base or a width of the second base and less than or equal to 0.5 times the width of the first base or the width of the second base; or the length between the two opposite ends of the channel is greater than or equal to 0.1 times a sum of a length of the first base, a length of the channel and a length of the second base and less than or equal to 0.3 times the sum of the length of the first base, the length of the channel and the length of the second base.

2. The bracket of claim 1, wherein the lead frame comprises two barrier structures, wherein the two barrier structures are respectively disposed on the first base and the second base, the two barrier structures are disposed in a misaligned manner in the extension direction of the channel, and lengths of the two barrier structures are equal in a first direction perpendicular to the extension direction of the channel.

3. The bracket of claim 1, wherein the lead frame comprises two barrier structures, wherein the two barrier structures are respectively disposed on the first base and the second base, and the two barrier structures are symmetrically arranged about the channel.

4. The bracket of claim 1, wherein part of the molded structure is disposed on a side of the lead frame, and an escape groove corresponding to the at least one barrier structure is disposed on the molded structure so that the at least one barrier structure is exposed from the escape groove.

5. The bracket of claim 1, wherein
    the lead frame further comprises a first arc structure disposed on the side of the first base facing the channel, at least one side of the one barrier structure on the first base in the extension direction of the channel is provided with the first arc structure, and the one barrier structure on the first base and the first base are connected in a smooth transition through the first arc structure; or
    the lead frame further comprises a first arc structure disposed on the side of the second base facing the channel, at least one side of the one barrier structure on the second base in the extension direction of the channel is provided with the first arc structure, and the one barrier structure on the second base and the second base are connected in a smooth transition through the first arc structure.

6. A light-emitting diode (LED) device, comprising the bracket of claim 1.

7. A bracket comprising: a lead frame and a molded structure connected to the lead frame, wherein the lead frame comprises:
a first lead portion comprising a first base;
a second lead portion comprising a second base spaced from the first base, wherein a cap between the first base and the second base forms a channel, the first lead portion and the second lead portion are insulated from each other, and part of the molded structure is filled in the channel; and
at least one barrier structure, wherein
one barrier structure is disposed on a side of the first base facing the channel and between two opposite ends of the first base in an extension direction of the channel and protrudes from the first base;
one barrier structure is disposed on a side of the second base facing the channel and between two opposite ends of the second base in an extension direction of the channel and protrudes from the second base; or
one barrier structure is disposed on a side of the first base facing the channel and between two opposite ends of the first base in an extension direction of the channel and protrudes from the first base, and one barrier structure is disposed on a side of the second base facing the channel and between two opposite ends of the second base in the extension direction of the channel and protrudes from the second base;
wherein a length between two opposite ends of the channel is greater than a length of a middle part of the channel so that a "wide-narrow-wide" pattern is formed;
wherein at least one of the first base or the second base is provided with a through hole, wherein the through hole is an elongated hole, and an included angle exists between a length direction of the through hole and the extension direction of the channel; or the through hole is a circular through hole; and
wherein the lead frame further comprises a first projection connected to an inner wall surface of the through hole, wherein the first projection extends towards an inner side of the through hole.

8. The bracket of claim 7, wherein
the lead frame further comprises a second projection disposed along an outer periphery of at least one of the first base or the second base;
the lead frame further comprises a third projection disposed on a side of the lead frame facing the channel; or
the lead frame further comprises a second projection disposed along an outer periphery of at least one of the first base or the second base and the lead frame further comprises a third projection disposed on a side of the lead frame facing the channel.

9. The bracket of claim 7, wherein the lead frame comprises two barrier structures, wherein the two barrier structures are respectively disposed on the first base and the second base, and the two barrier structures are symmetrically arranged about the channel.

10. A bracket, comprising: a lead frame and a molded structure connected to the lead frame, wherein the lead frame comprises:
a first lead portion comprising a first base;
a second lead portion comprising a second base spaced from the first base, wherein a gap between the first base and the second base forms a channel, the first lead portion and the second lead portion are insulated from each other, and part of the molded structure is filled in the channel; and
at least one barrier structure, wherein
one barrier structure is disposed on a side of the first base facing the channel and between two opposite ends of the first base in an extension direction of the channel and protrudes from the first base:
one barrier structure is disposed on a side of the second base facing the channel and between two opposite ends of the second base in an extension direction of the channel and protrudes from the second base; or
one barrier structure is disposed on a side of the first base facing the channel and between two opposite ends of the first base in an extension direction of the channel and protrudes from the first base, and one barrier structure is disposed on a side of the second base facing the channel and between two opposite ends of the second base in the extension direction of the channel and protrudes from the second base;
wherein a length between two opposite ends of the channel is greater than a length of a middle part of the channel so that a "wide-narrow-wide" pattern is formed;
wherein the first lead portion further comprises a plurality of first pins protruding from the first base; and
wherein the second lead portion further comprises a plurality of second pins protruding from the second base, an extension direction of each of the plurality of first pins is arranged at an angle with or parallel to the extension direction of the channel, an extension direction of each of the plurality of second pins is arranged at an angle with or parallel to the extension direction of the channel, the plurality of first pins are disposed on a side of the first base facing away from the channel, and the plurality of second pins are disposed on a side of the second base facing away from the channel.

11. The bracket of claim 10, wherein
the lead frame further comprises a first arc structure disposed on the side of the first base facing the channel, at least one side of the one barrier structure on the first base in the extension direction of the channel is provided with the first arc structure, and the one barrier structure on the first base and the first base are connected in a smooth transition through the first arc structure; or the lead frame further comprises a first arc structure disposed on the side of the second base facing the channel, at least one side of the one barrier structure on the second base in the extension direction of the channel is provided with the first arc structure, and the one barrier structure on the second base and the second base are connected in a smooth transition through the first arc structure; and
the molded structure comprises second arc structures connected to the plurality of first pins of the lead frame, wherein at least one side of each of the plurality of first pins is provided with a respective one of the second arc structures;
the molded structure comprises third arc structures connected to the plurality of second pins of the lead frame, wherein at least one side of each of the plurality of second pins is provided with a respective one of the third arc structures; or the molded structure comprises second arc structures connected to the plurality of first pins of the lead frame, wherein at least one side of each of the plurality of first pins is provided with a respective one of the second arc structures; and the molded structure comprises third arc structures connected to the plurality of second pins of the lead frame, wherein at least one side of each of the plurality of second pins is provided with a respective one of the third arc structures.

12. The bracket of claim 10, wherein
an included angle A exists between an extension direction of one of the plurality of first pins and the extension direction of the channel and satisfies that A=90°±10°; or
an included angle B exists between an extension direction of one of the plurality of second pins and the extension direction of the channel and satisfies that B=90°±10°.

13. The bracket of claim 10, wherein the lead frame comprises two of the plurality of first pins spaced apart in the extension direction of the channel; or the lead frame comprises two of the plurality of second pins arranged spaced apart in the extension direction of the channel.

14. The bracket of claim 10, wherein the lead frame further comprises a plurality of indentations arranged at intervals on at least one surface of a surface of the first base or a surface of the second base facing the molded structure.

15. The bracket of claim 14, wherein the plurality of indentations extend in the extension direction of the channel and are disposed at at least one end of an end of the first base or an end of the second base away from the channel in the first direction perpendicular to the extension direction of the channel.

16. The bracket of claim 10, wherein the lead frame further comprises at least one first recessed groove, wherein at least one side of the first base is provided with one first recessed groove in the extension direction of the channel, at least one side of the second base is provided with one first recessed groove in the extension direction of the channel, or at least one side of the first base is provided with one first recessed groove in the extension direction of the channel and at least one side of the second base is provided with one first recessed groove in the extension direction of the channel.

17. The bracket of claim 16, wherein the lead frame further comprises at least one second recessed groove, wherein the side of the first base facing away from the channel is provided with one second recessed groove, the side of the second base facing away from the channel is provided with one second recessed groove, or the side of the first base facing away from the channel is provided with one second recessed groove and the side of the second base facing away from the channel is provided with one second recessed groove.

18. The bracket of claim 17, wherein each of the at least one second recessed groove comprises at least two groove segments that communicate with each other, wherein in the first direction, widths of the at least two groove segments decrease sequentially in a direction towards the channel.

19. The bracket of claim 18, wherein a ratio of widths of two adjacent ones of the at least two groove segments is between 1 and 2.

20. The bracket of claim 18, wherein the at least two groove segments comprise a first groove segment, a second groove segment and a third groove segment that communicate sequentially, wherein in the direction towards the channel, a width of the first groove segment, a width of the second groove segment and a width of the third groove segment decrease sequentially.

* * * * *